United States Patent [19]
Mizutani

[11] Patent Number: 5,602,399
[45] Date of Patent: Feb. 11, 1997

[54] SURFACE POSITION DETECTING APPARATUS AND METHOD

[75] Inventor: Hideo Mizutani, Yokohama, Japan

[73] Assignee: Nikon Corporation, Japan

[21] Appl. No.: 581,973

[22] Filed: Jan. 2, 1996

Related U.S. Application Data

[63] Continuation of Ser. No. 264,672, Jun. 23, 1994, abandoned.

[30] Foreign Application Priority Data

| Jun. 23, 1993 | [JP] | Japan | 5-151861 |
| Dec. 9, 1993 | [JP] | Japan | 5-309187 |

[51] Int. Cl.$^6$ ................................ G03B 27/42
[52] U.S. Cl. .............. 250/548; 250/559.20; 356/401; 355/53
[58] Field of Search ................ 250/548, 559.29, 250/559.30, 201.4; 356/400, 401, 399; 355/43, 53, 57

[56] References Cited

U.S. PATENT DOCUMENTS

| 4,558,949 | 12/1985 | Uehara et al. | 356/400 |
| 4,874,954 | 10/1989 | Takahashi et al. | 250/548 |
| 4,902,900 | 2/1990 | Kamiya et al. | 250/548 |
| 4,952,970 | 8/1990 | Suzuki et al. | 355/43 |
| 5,015,866 | 5/1991 | Hayashi | 250/548 |
| 5,118,957 | 6/1992 | Kawashima et al. | 250/559.29 |
| 5,124,562 | 6/1992 | Kawashima et al. | 250/548 |
| 5,414,515 | 5/1995 | Kawashima | 356/400 |
| 5,416,562 | 5/1995 | Ota et al. | 355/53 |
| 5,434,425 | 7/1995 | Ishiyama | 250/548 |

FOREIGN PATENT DOCUMENTS

| 56-42205 | 4/1981 | Japan. |
| 4215015 | 8/1992 | Japan. |
| 5129182 | 5/1993 | Japan. |
| 697045 | 4/1994 | Japan. |

Primary Examiner—Edward P. Westin
Assistant Examiner—John R. Lee
Attorney, Agent, or Firm—Pennie & Edmonds

[57] ABSTRACT

A surface position detecting apparatus is suitable for detecting a position of a surface of the substrate supported by a support means in an exposure apparatus. The surface position detecting apparatus comprises a light source, an irradiation optical system for irradiating light from the light source obliquely onto the substrate surface and forming an image of a measurement pattern of a pattern plate on the substrate surface, and a converging optical system for converging light irradiated from the irradiation optical system and then reflected by the substrate surface to re-image the image of the measurement pattern on a photodetector surface. The photodetector can detect the surface position based on the position of pattern image re-imaged on the photodetector surface. The image of the measurement pattern comprises a linear image extending in a predetermined direction. Also, a direction in which the line image of the measurement pattern on the substrate surface is displaced when the substrate is vertically moved is neither parallel nor perpendicular to a longitudinal direction of the measurement pattern image.

47 Claims, 12 Drawing Sheets

SURFACE POSITION DETECTING APPARATUS AND METHOD

This is a continuation, of application Ser. No. 08/264,672, filed Jun. 23, 1994 now abandoned.

BACKGROUND OF THE INVENTION

1. Field of the Invention

The present invention relates to a surface position detecting apparatus and a method therefor. More particularly, the invention relates to an apparatus and a method for detecting a surface position, which are suitably applicable to detection of surface position (height distribution) of a semiconductor wafer on which a circuit pattern with directionality is formed, for example in projection exposure apparatus (as so called as steppers) for fabricating semiconductors.

2. Related Background Art

Exposure apparatus are used to transfer a circuit pattern formed on a photomask or reticle (hereinafter generally referred to as "reticle") onto a photosensitive-material-coated wafer through a projection optical system. Such an exposure apparatus is provided with an autofocus mechanism and an auto-leveling mechanism for effecting exposure under the condition that an exposed surface of wafer is aligned with an image-forming plane of projection optical system within the range of depth of focus. The autofocus mechanism is for setting each of positions (focus positions) of predetermined measurement points on the exposed surface of wafer in the direction of the optical axis of projection optical system, at the best focus position, while the auto-leveling mechanism is for setting an average plane of the exposed surface of wafer in parallel with the image-forming plane of projection optical system.

For accurate operations of the autofocus mechanism or the auto-leveling mechanism, it is necessary for a surface position detecting apparatus to accurately measure a focus position of a selected one or each of plural measurement points on the exposed surface of wafer. The projection optical system of exposure apparatus has a relatively shallow depth of focus and there is a case that recesses and projections are locally scattered on a wafer. Therefore, the surface position detecting apparatus is required to accurately detect a focus position of each selected measurement point on the exposed surface of wafer.

A conventionally known surface position detecting apparatus is for example an oblique incidence autofocus sensor (hereinafter referred to as "AF sensor") which projects a slit pattern image in an oblique direction onto measurement points on an exposed surface or detected surface of wafer and which collects reflected light from the detected surface to re-image the slit pattern image. In this case, a vertical movement of the exposed surface of wafer in the normal direction (the direction of the optical axis of projection optical system) causes a horizontal shift of the re-imaged position of slit pattern image. Then a focus signal corresponding to the focus position of each measurement point on the exposed surface can be obtained for example by vibrating the slit pattern image on a light-receiving element using a vibrating mirror and then performing synchronous rectification of an output signal from the light-receiving element with a drive signal of the vibrating mirror.

An example of conventional oblique incidence AF sensor is one as disclosed in Japanese Patent Application No. 4-247748, in which a slit pattern image is projected onto numerous two-dimensionally distributed measurement points on a detected surface, the position detection is carried out by the vibration method, and the light reception efficiency is enhanced using a tilt correcting prism. Also, there is another example as disclosed in Japanese Patent Application No. 2-401880, in which a slit pattern image is projected onto numerous one-dimensionally distributed measurement points on a diagonal line of shot area (chip pattern) on the exposed surface of wafer and the position detection is carried out by the vibration method.

Further, Japanese Patent Application No. 3-311758 discloses a position detecting apparatus of an image processing method, in which a two-dimensional pattern is obliquely projected onto an exposed surface of wafer and a re-focused image of the pattern is subjected to image processing whereby focus positions are detected for numerous measurement points on the exposed surface. This apparatus also employs a tilt correcting prism to enhance the light reception efficiency. Japanese Patent Publication No. 1-41962 discloses another apparatus, in which a slit pattern image is projected onto a measurement point on a detected surface and the direction of slit pattern image is inclined relative to the direction of circuit pattern on the detected surface.

Generally, in case of the detected surface being an exposed surface of semiconductor wafer, an IC chip pattern is formed on the exposed surface in preceding steps. Further, a contour of IC chip pattern is usually rectangular and the chip pattern is often parallel to the sides of the rectangular contour. Then, in order to reduce influence of the chip pattern on the exposed surface of wafer, the conventional surface position detecting apparatus are so arranged that a measurement pattern image is projected onto the exposed surface of wafer with the longitudinal direction of each slit in the measurement slit pattern image making an angle of about 45° with each side of the contour of chip pattern.

Taking a reference plane on a plane formed by the optical axis of a light-supply optical system or irradiation optical system in the surface position detecting apparatus and the normal line to the exposed surface, as the exposed surface is displaced in the direction of the optical axis of projection optical system, the measurement pattern image is shifted in parallel with the reference plane. The conventional apparatus are thus so arranged in order to maximize the detection sensitivity that the reference plane becomes perpendicular to the longitudinal direction of each slit in the measurement pattern image. However, in case the position detection is carried out for multiple points on the exposed surface of wafer while keeping the reference plane perpendicular to the longitudinal direction of measurement pattern image as described, the light-supply optical system and light-reception optical system in the surface position detecting apparatus need to cover an area with a width greater than the diagonal line of the contour of chip pattern, which caused a disadvantage of a size increase of optical systems. This results in an increase in production cost of apparatus and an increase of unstable factors in measurement results due to the size increase of apparatus.

Further, in case the reference plane is perpendicular to the longitudinal direction of measurement pattern as in the conventional apparatus, the chip pattern defines the direction of incidence of light for position detection, which is the direction of reference plane. This causes a problem that the arrangement of optical systems in the surface position detecting apparatus can not be changed for example as to match the constitution of semiconductor exposure apparatus.

SUMMARY OF THE INVENTION

It is, therefore, an object of the present invention to decrease the size of surface position detecting apparatus and to clear the restrictions on the arrangement of optical systems in the surface position detecting apparatus.

In order to attain the above-mentioned object, in accordance with the present invention, we provide a surface position detecting apparatus, which projects an image of a predetermined measurement pattern obliquely onto a surface of a plate object to be detected, which converges reflected light from the detected surface to re-image the image of the measurement pattern, and which then performs position detection of the detected surface relative to a predetermined reference plane in accordance with a re-imaged position of the image of the measurement pattern, comprising: a light source; an irradiation optical system for irradiating light from the light source obliquely onto the reference plane; a pattern plate having the measurement pattern, the pattern plate being located on a predetermined first plane so that the image of the measurement pattern is formed on the reference plane by the irradiation optical system; a converging optical system for, in a state where the detected surface of the object to be detected is substantially coincident with the reference plane, converging light irradiated from the irradiation optical system and then reflected by the detected surface to re-image the image of the measurement pattern on a predetermined second plane; and detecting means for detecting the re-imaged position of the image of the measurement pattern on the second plane; wherein the image of the measurement pattern comprises a linear image extending in a predetermined direction; and wherein the pattern plate is disposed such that an angle α between a direction in which the line image of the measurement pattern on the detected surface is displaced when the detected surface is moved along a direction perpendicular to the reference plane, and a longitudinal direction of the line image of the measurement pattern is in the range of from greater than 0° to less than 90°.

The surface position detecting apparatus of the present invention is suitable for projection type exposure apparatus which are used for production of semiconductor devices.

The present invention will become more fully understood from the detailed description given hereinbelow and the attached drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

In the course of the following detailed description, reference will be made to the attached drawings in which.

DETAILED DESCRIPTION OF THE PREFERRED EMBODIMENTS

Figure 1:
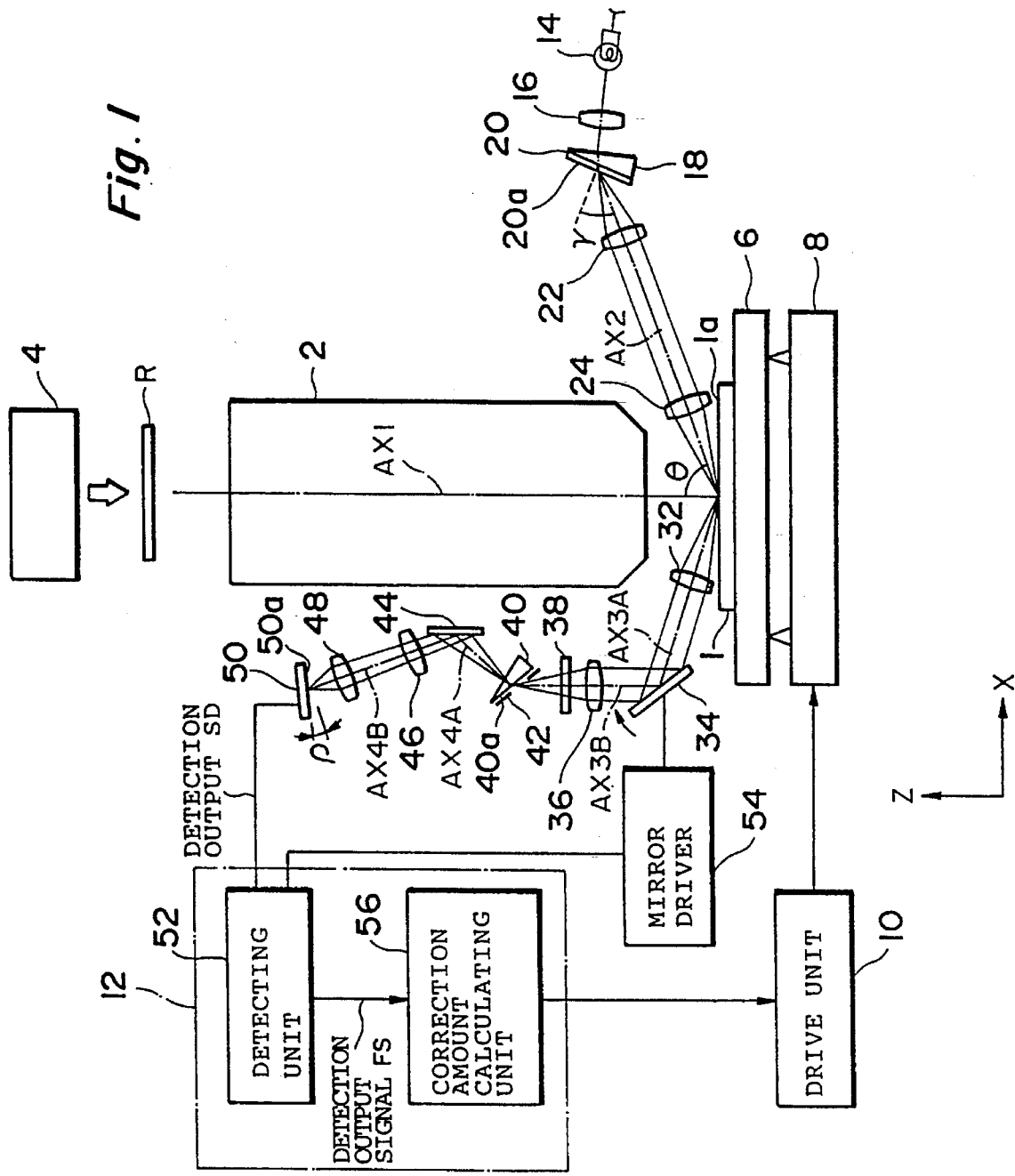
FIG. 1 is a schematic drawing to show the structure of a projection exposure apparatus to which the first embodiment of the present invention is applied.

In the following description, like reference characters designate like or corresponding parts throughout the several views.

Referring now to the drawings, and particularly, to FIG. 1, there is schematically shown the structure of a reduction projection exposure apparatus provided with a surface position detecting apparatus according to the present invention. In the reduction projection exposure apparatus, a surface of reticle R with a circuit pattern formed thereon is located as conjugate with a surface (exposed surface) of wafer 1 as an object to be detected with respect to a both-side or one-side telecentric projection optical system or projection objective lens 2, and a main illumination optical system 4 illuminates the circuit pattern of reticle R with main illumination light whereby an image of the circuit pattern is demagnified and projected on a shot area in the surface of wafer 1. In this embodiment, the surface of wafer 1 is coated with a photoresist as a photosensitive material, on which the circuit pattern of reticle R is printed.

The wafer 1 is held on a wafer holder 6 and the wafer holder 6 is mounted on a wafer stage 8. The wafer stage 8 is provided, though not clearly shown in FIG. 1, with an XY stage for moving the wafer holder 6 within a plane perpendicular to the optical axis AX1 of projection objective lens 2 (here, the X axis and Y axis are taken as orthogonal coordinate axes on this plane), a Z stage for moving the wafer holder 6 in the Z direction (vertical direction) parallel to the optical axis AX1 of projection objective lens 2, and a leveling mechanism for setting the surface of wafer 1 held on the wafer holder 6 in parallel with the best focus plane of projection objective lens 2. An example of known leveling mechanism is one provided with three support members arranged at equal intervals in the circumferential direction on the upper surface of wafer stage 8 and supporting the lower surface of wafer holder 6 at their tip ends. The leveling mechanism is so constructed that inclination of wafer 1 on the wafer holder 6 can be adjusted by adjusting a projection amount in the Z direction, of each support member.

A control unit 12 is connected to the wafer stage 8 through a drive unit 10 for driving the wafer stage 8, so that the control unit 12 can control a motion of wafer stage 8. Actual printing exposure of the circuit pattern of reticle R onto the wafer 1 is executed according to the step-and-repeat method to repeat the step of exposure for each shot area while moving the wafer 1 by a predetermined amount in the X direction and/or in the Y direction.

In order to transfer an image of circuit pattern of reticle R onto the exposed surface of wafer 1 in an excellent state, a shot area on the exposed surface must be aligned with an image-forming plane of projection optical system 2 within the range of depth of focus. For that purpose, the exposure apparatus is normally provided with an autofocus mechanism and an auto-leveling mechanism. The autofocus mechanism and auto-leveling mechanism perform focusing and leveling of wafer 1 by detecting Z-directional positions of plural measurement points in the shot area of wafer 1, controlling the drive of Z stage, and controlling a projection amount of each support member in the leveling mechanism.

The shown embodiment employs a surface position detecting apparatus of the present invention as means for detecting the Z-directional positions of plural measurement points in the shot area of wafer 1, which will be described below.

In FIG. 1, a light source 14 emits white light with wide wavelength band, and a condenser lens 16 converts illumination light from the light source 14 into a beam of substantially parallel rays, which is incident into a deflecting prism 18. The deflecting prism 18 deflects, by refraction, the beam of substantially parallel rays from the condenser lens 16, and the deflected beam is outgoing therefrom. A transmission-type grating pattern plate 20 is attached to the exit-side surface of the deflecting prism 18, and the grating pattern plate 20 has a grating-pattern-formed surface 20a on the wafer 1 side, on which a grating pattern of streaks is formed in such an array that transmitting portions and shielding portions are alternately arranged at a predetermined pitch as extending in a predetermined direction. This transmission-type grating pattern may be replaced by a phase-type reflection diffraction grating of grooves and projections, or further by an amplitude-type reflection grating pattern in which reflecting portions and non-reflecting portions are alternately arranged.

Figure 15:
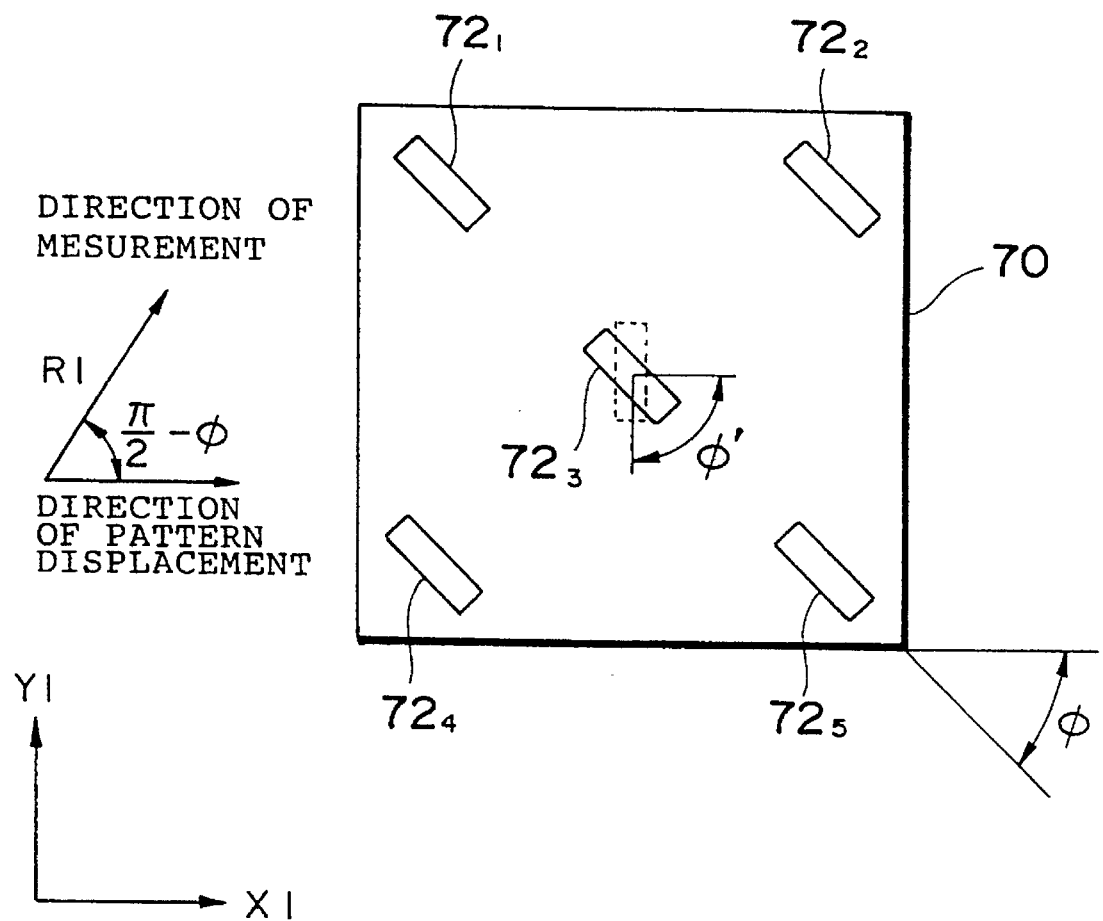
FIG. 15 is a plan view to show a pattern plate provided with apertures for illuminating measurement points on a shot area of wafer.

Further, as detailed later, the grating pattern plate 20 may be replaced by a pattern plate 70 having a plurality of apertures for projecting a slit (linear) pattern onto each of portions corresponding to a plurality of measurement points, as shown in FIG. 15.

Since the exposed surface (detected surface) of wafer 1 is normally covered with a thin film of photoresist or the like, the light source 14 is preferably one emitting white light with broad wavelength band as described above in order to reduce the influence of thin film interference. The light source 14 may be a light emitting diode for emitting light in a wavelength band to which the photosensitive material such as the photoresist is little sensitive.

After the illumination light enters the grating pattern plate 20 and goes out of the grating-pattern-formed surface 20a, it enters an irradiation optical system 22, 24 set along the optical axis AX2 intersecting at an angle θ with the optical axis AX1 of projection optical system 2. The irradiation optical system 22, 24 is composed of a condenser lens 22 and an irradiation objective lens 24 so that the grating-pattern-formed surface 20a is arranged conjugate with the exposed surface of wafer 1 with respect to the irradiation optical system 22, 24. Since the optical axis AX2 of irradiation optical system 22, 24 obliquely intersects with the exposed surface of wafer 1, the grating-pattern-formed surface 20a and the exposed surface of wafer 1 are arranged to satisfy the Scheimpflug condition with respect to the irradiation optical system 22, 24.

Figure 2:
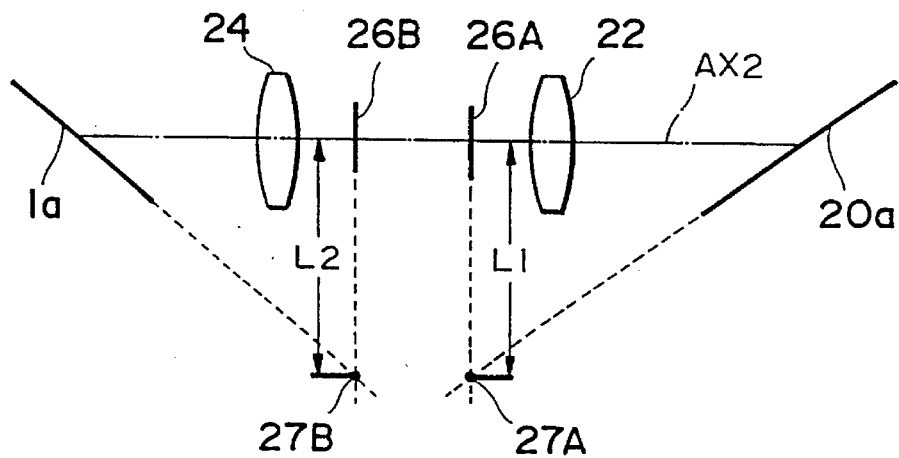
FIG. 2 is an explanatory drawing to illustrate the Scheimpflug condition.

FIG. 2 schematically shows a state in the vicinity of the irradiation optical system 22, 24 in FIG. 1. In the meridional cross section of the irradiation optical system 22, 24 shown in FIG. 2, let 27A be an intersection between a straight line on the grating-pattern-formed surface 20a and an object-side principal plane 26A of irradiation optical system 22, 24, and 27B be an intersection between a straight line on a shot area 1a in wafer 1 and an image-side principal plane 26B of irradiation optical system 22, 24. In this case, that the Scheimpflug condition is satisfied means that a distance L1 from the intersection 27A to the optical axis AX2 of irradiation optical system 22, 24 is equal to a distance L2 from the intersection 27B to the optical axis AX2. When the Scheimpflug condition is satisfied, an imaging relation of so-called tilting holds, so that a beam emergent from an arbitrary point on the grating-pattern-formed surface 20a is converged at a corresponding point on a plane including the shot area 1a. Accordingly, an image of the grating pattern on the grating-pattern-formed surface 20a is accurately formed over the entire plane including the shot area 1a on the wafer 1.

Figure 3:
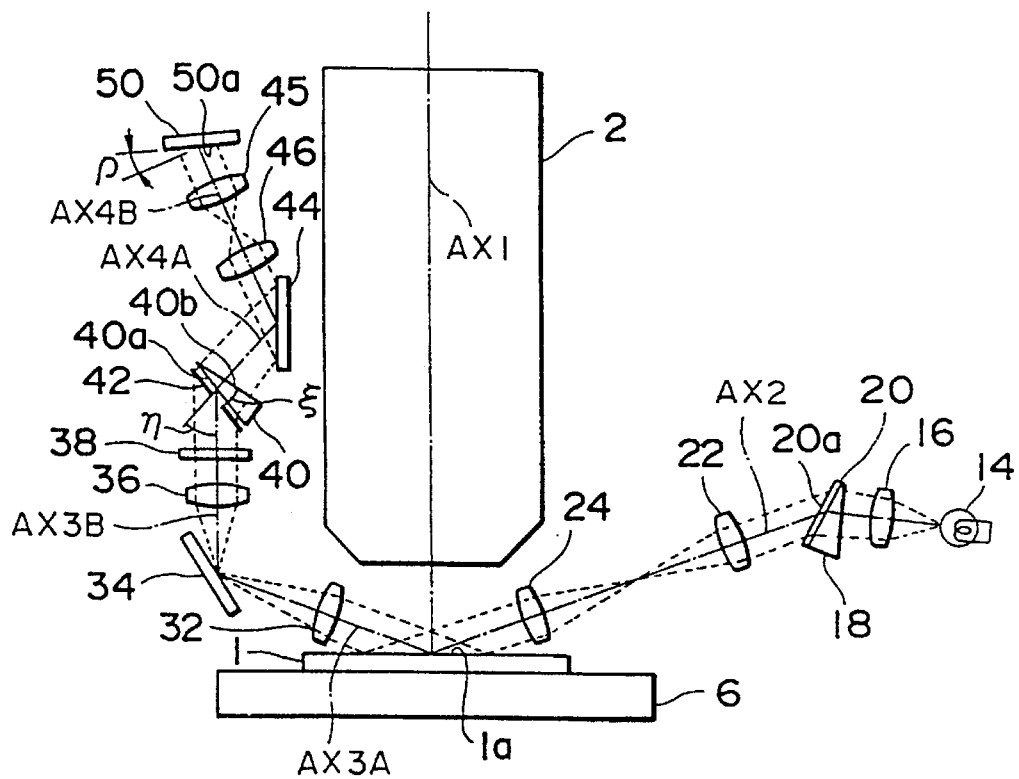
FIG. 3 is an explanatory drawing to show optical paths in optical systems in a surface position detecting apparatus in FIG. 1.

Further, as shown by optical paths represented by dotted lines in FIG. 3, the irradiation optical system 22, 24 composed of the condenser lens 22 and the irradiation objective lens 24 is a so-called both-side telecentric optical system, so that a same magnification ratio can be applied over the entire surfaces between a point on the grating-pattern-formed surface 20a and a point conjugate therewith on the exposed surface of wafer 1. Since this example employs the grating pattern of streaks formed at the predetermined pitch on the grating pattern surface 20a, a grating pattern image is projected or formed on the exposed surface of wafer 1 in such a pattern that bright portions and dark portions are alternately repeated in a predetermined direction.

Figure 4:
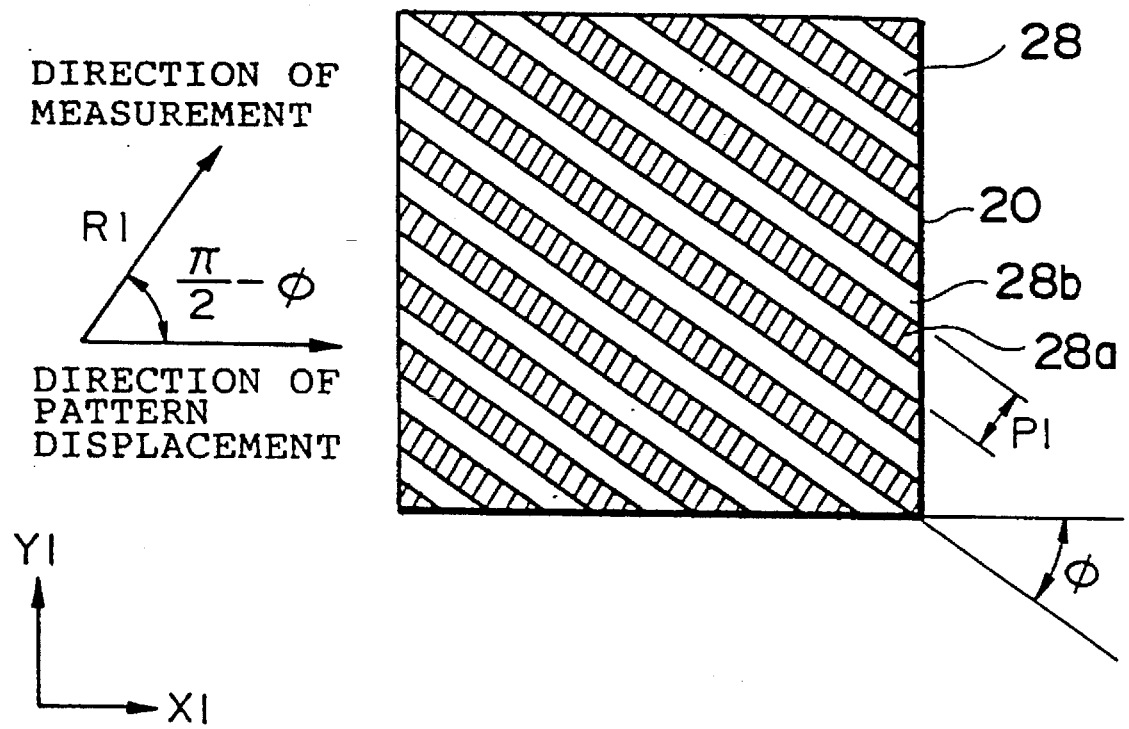
FIG. 4 is a plan view to show a measurement grating pattern on a grating pattern plate.
Figure 5:
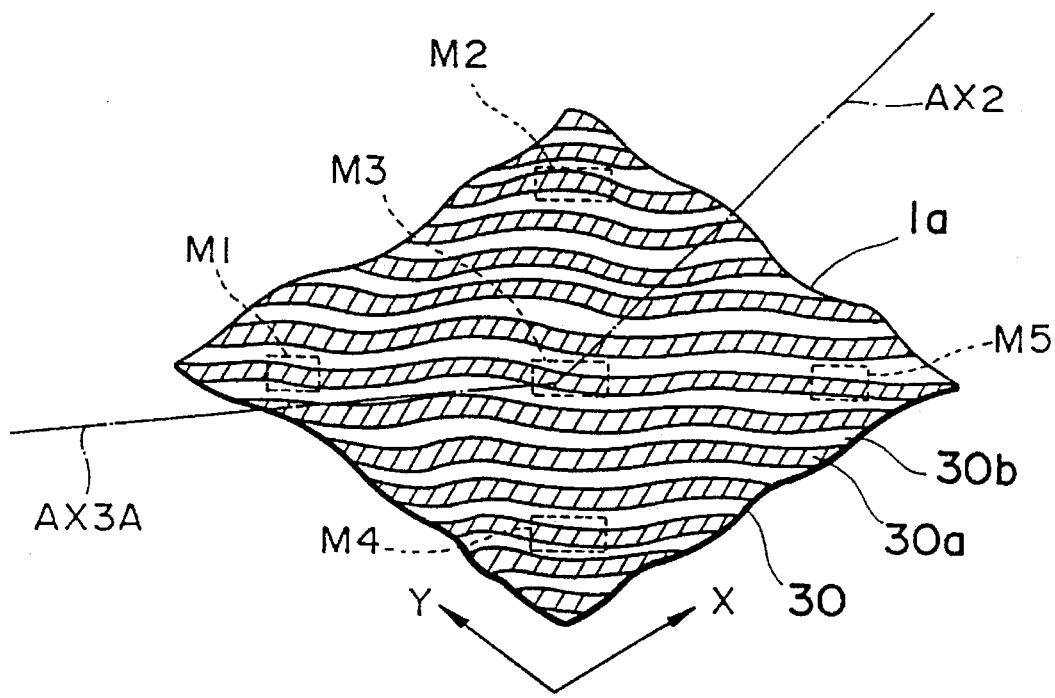
FIG. 5 is a perspective view to show a pattern image projected on a shot area in an exposed surface of wafer.

FIG. 4 shows the grating pattern formed on the grating pattern plate 20 in FIG. 1. In FIG. 4, defining an X1 direction and a Y1 direction as directions conjugate with the X direction parallel to the plane of FIG. 1 and the Y direction normal to the plane of FIG. 1, the grating pattern 28 is so formed that light-shielding portions 28a and light-transmitting portions 28b extending in a direction intersecting at a clockwise angle Φ with the X1 direction are arranged at pitch P1 in a direction intersecting at a counterclockwise angle (π/2-Φ) with the X1 direction. In the present embodiment the pitch P1 is in the range of about 0.3 mm to about 1.0 mm. As shown in FIG. 5, a grating pattern image 30 is formed or projected on the shot area 1a in the exposed surface of wafer 1 in FIG. 1 in such a pattern that dark portions 30a and bright portions 30b are formed corresponding to the light-shielding portions 28a and light-transmitting portion 28b in the grating pattern 28 in FIG. 4.

Returning to FIG. 1, the illumination light obliquely irradiated onto the exposed surface of wafer 1 is reflected by the exposed surface to enter a converging optical system 32–36. The converging optical system 32–36 is composed of a converging objective lens 32, a vibrating mirror 34 and a condenser lens 36. The illumination light reflected on the exposed surface of wafer 1 is collected by the converging objective lens 32 and then reflected by the vibrating mirror 34, and the reflected light passes through the condenser lens 36 and a half wave plate 38 whereby the grating pattern image projected onto the exposed surface of wafer 1 is re-imaged on an entrance surface 40a of a tilt correcting prism 40. The optical axis AX3B of condenser lens 36 is an axis obtained by folding the optical axis AX3A of converging objective lens 32 by the vibrating mirror 34.

The optical axis AX2 of irradiation optical system 22, 24 is arranged in axial symmetry with the optical axis AX3A of converging objective lens 32 with respect to the optical axis AX1 of projection optical system 2. Also, the vibrating mirror 34 is located substantially on a pupil plane (Fourier transform plane) of the converging optical system 32–36, but the vibrating mirror 34 may be located at any position as long as it is in the optical path between the exposed surface of wafer 1 and the entrance surface 40a of tilt correcting prism 40.

In the state that the exposed surface of wafer 1 is substantially coincident with the image-forming plane of projection optical system 2, the entrance surface 40a of tilt correcting prism 40 is located on a plane conjugate with the exposed surface of wafer 1 with respect to the converging optical system 32–36. A light-receiving slit plate 42 with a plurality of apertures (slits) formed therein is attached to the entrance surface 40a, so that the illumination light passing through the plurality of apertures in the light-receiving slit plate 42 is incident into the tilt correcting prism 40.

Figure 6:
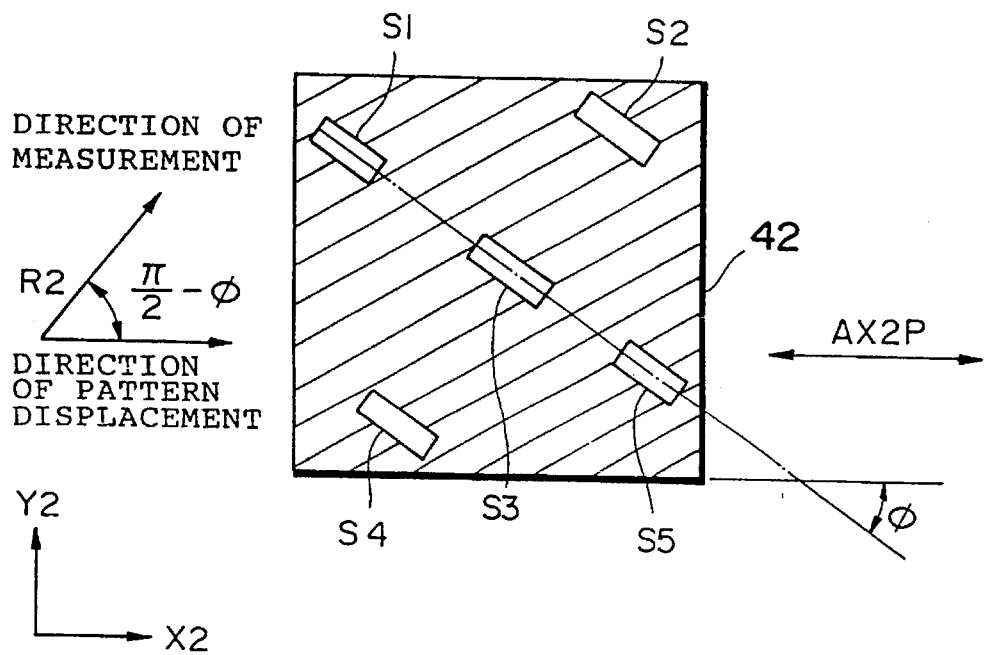
FIG. 6 is a plan view to show a layout of apertures in a light-receiving slit plate.

FIG. 6 shows a layout of the plural apertures formed in the light-receiving slit plate 42. In FIG. 6, defining an X2 direction and a Y2 direction as directions conjugate with the X direction parallel to the plane of FIG. 1 and the Y direction normal to the plane of FIG. 1, respectively, three apertures S5, S3, S1 are formed on the light-receiving slit plate 42 along a straight line extending in a direction intersecting at a clockwise angle Φ with the X2 direction, and apertures S4 and S2 are formed on the both sides of the center aperture S3 in a direction intersecting at a counterclockwise angle (π/2-Φ) with the X2 direction. Providing such apertures S1–S5, height detection is conducted for five measurement points (detected areas) M1–M5 on the shot area 1a in wafer 1 in FIG. 5, conjugate with the five apertures S1–S5 on the light-receiving slit plate 42 with respect to the converging optical system 32–36. If it is desired to increase the number of measurement points in the shot area 1a of wafer 1, the number of apertures can be simply increased in the light-receiving slit plate 42. Thus, no complication of structure is caused by increasing the number of measurement points.

Returning to FIG. 1, in the state that the exposed surface of wafer 1 is substantially coincident with the image-forming plane of projection optical system 2, the exposed surface of wafer 1 and the entrance surface 40a of tilt correcting prism 40 are arranged to satisfy the Scheimpflug condition with respect to the converging optical system 32–36. Accordingly, in the state that the exposed surface of wafer 1 is substantially coincident with the image-forming plane of projection optical system 2, the grating pattern image 30 on the exposed surface of wafer 1 (see FIG. 5) is re-imaged over the entire entrance surface 40a.

Further, as shown by the optical paths represented by the dotted lines in FIG. 3, the converging optical system 32–36 is a so-called both-side telecentric optical system and a same magnification ratio can be applied over the entire surfaces between a point on the exposed surface of wafer 1 and a point conjugate therewith on the entrance surface 40a of tilt correcting prism 40. Therefore, a grating pattern image similar to the grating pattern image 30 imaged or projected on the exposed surface of wafer 1 is re-imaged on the entrance surface 40a.

In summary, the present embodiment is so arranged that in the state that the exposed surface of wafer 1 is substantially coincident with the image-forming plane of projection optical system 2, the Scheimpflug condition is satisfied between the grating-pattern-formed surface 20a of grating pattern plate 20 and the exposed surface of wafer 1 and between the exposed surface of wafer 1 and the entrance surface 40a of tilt correcting prism 40. In addition, the projection magnification of from the grating-pattern-formed surface 20a to the exposed surface of wafer 1 and the projection magnification of from the exposed surface of wafer 1 to the entrance surface 40a are constant over the entire surfaces.

In the next place, a horizontal shift amount y of the grating pattern image on the entrance surface 40a of tilt correcting prism 40 is obtained for a displacement z of the exposed surface of wafer 1 in the direction of the optical axis AX1 of projection optical system 2. Specifically, letting θ be an angle of incidence of the illumination light onto the exposed surface of wafer 1 along the optical axis AX2 of irradiation optical system 22, 24, β be a lateral magnification of the converging optical system 32–36, and β' be a magnification along the tilting image-forming plane, from the exposed surface of wafer 1 to the entrance surface 40a of tilt correcting prism 40, the horizontal shift amount y is expressed as follows.

$$y = 2 \cdot \beta' \cdot \tan\theta \cdot z \qquad (1)$$
$$= 2 (\beta^2 \sin^2\theta + \beta^4 \sin^4\theta/\cos^2\theta)^{1/2} \cdot z$$

As understood from this formula, as the incidence angle θ of the illumination light for projecting the grating pattern image onto the exposed surface of wafer 1 increases, the horizontal shift amount y also increases, whereby the position detection can be conducted with high resolution in the direction of the optical axis of projection optical system 2. The incidence angle θ is preferably 80° for example.

Incidentally, in FIG. 1, the image formation of the irradiation optical system 22, 24 and the image formation of the converging optical system 32–36 each satisfy the Scheimpflug condition. Accordingly, letting γ be an angle between the normal line to the grating pattern plate 20 and the optical axis AX2 of irradiation optical system 22, 24, η be an angle between the normal line to the entrance surface 40a of tilt correcting prism 40 and the optical axis AX3B of condenser lens 36 (an average axis if vibrated) (the angle η is equal to the angle of incidence of principal rays of the illumination light incident onto the entrance surface 40a, as shown in FIG. 3 ), and $\beta_4$ be a lateral magnification of irradiation optical system 22, 24, the following relation holds.

$$\tan\gamma = \beta_4 \cdot \tan\theta, \quad \tan\eta = \beta \cdot \tan\theta' \qquad (2)$$

It is seen from the above formulas that as the incidence angle $\theta$ of illumination light onto the exposed surface of wafer 1 increases, the incidence angle $\eta$ of illumination light into the entrance surface 40a also increases. Then, if a light-receiving element (e.g., a photodiode) is placed near the entrance surface 40a of tilt correcting prism 40, a larger incidence angle $\eta$ of illumination light onto the light-receiving surface thereof would increase a reflection amount of the illumination light on the surface of the light-receiving element, whereby an eclipse would occur in the beam of illumination light, which considerably lowers the light reception efficiency.

The present embodiment is so arranged in order to avoid such lowering of light reception efficiency that the beam from the converging optical system 32–36 is deflected by the tilt correcting prism 40, as shown in FIG. 3. An apical angle $\xi$ of the tilt correcting prism 40 is so set that a refracted beam outgoing from the tilt correcting prism 40 becomes nearly parallel to a normal line to an exit surface 40b of tilt correcting prism 40. In this case, an angle of the beam outgoing from the tilt correcting prism 40 with respect to the beam incident into the tilt correcting prism 40 is $\xi/n_{25}$ where $n_{25}$ is an index of refraction of the tilt correcting prism 40. This angle is considerably smaller than the angle $\eta$ between the beam incident into the tilt correcting prism 40 through the converging optical system 32–36 and the entrance surface 40a.

Further, a relay optical system 44–46 composed of a plane mirror 44, a first relay lens 46 and a second relay lens 48 is disposed on the exit side of the tilt correcting prism 40. This relay optical system 44–48 is also both-side telecentric as shown by the dashed lines for rays. The exit-side optical axis AX4B of relay optical system 44–48 is an axis obtained by folding the entrance-side optical axis AX4A of relay optical system 44–48 by the plane mirror 44.

Returning to FIG. 1, the beam outgoing from the tilt correcting prism 40 is reflected by the plane mirror 44 and thereafter passes through the first relay lens 46 and the second relay lens 48 to form a further conjugate image of the grating pattern image formed on the entrance surface 40a of tilt correcting prism 40, on a light-receiving surface 50a of a photoelectric detector 50.

Figure 7:
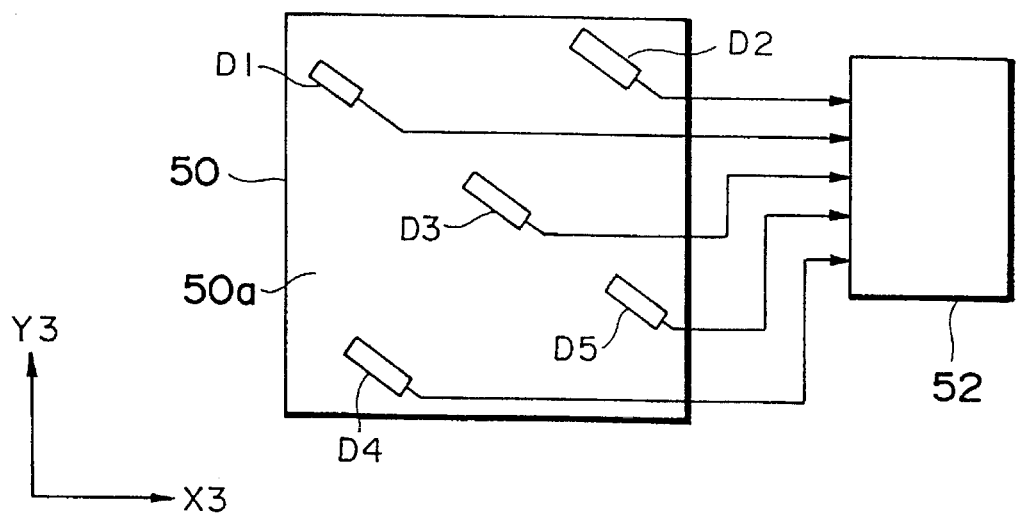
FIG. 7 is a plan view to show a layout of light-receiving elements on a photoelectric detector.

FIG. 7 shows the light-receiving surface 50a of photoelectric detector 50 in FIG. 1. In FIG. 7, an X3 direction and a Y3 direction are taken in respective directions on the light-receiving surface 50a of photoelectric detector 50 as conjugate with the X2 direction and Y2 direction in FIG. 6. There are three photodetectors D5, D3, D1 along a straight line intersecting with the X3 direction and two photodetectors D2 and D4 on the both sides of the center photodetector D3 on the light-receiving surface 50a of photoelectric detector 50. Each of the photodetectors D1–D5 is a photodiode, and images of the apertures S1–S5 in the light-receiving slit plate 42 in FIG. 6 are projected onto the photodetectors D1–D5, respectively. A conjugate image of aperture S1–S5 is substantially the same as the shape of light-receiving surface of photodetector D1–D5. Then, detection outputs from the five photodetectors D1–D5 (hereinafter the five detection outputs all are totally called as "detection output SD") are supplied to a detecting unit 52 in the control unit 12. Photomultipliers may be employed as the photodetectors D1–D5.

Here, the function of the tilt correcting prism 40 is described referring to FIG. 3. In FIG. 3, $\eta$ represents the angle of incidence of a beam parallel to the exit-side optical axis AX3B of converging optical system 32–36 relative to the entrance surface 40a of tilt correcting prism 40, and $n_{25}$ the index of refraction of the tilt correcting prism 40. Then a refraction angle $\xi$ of the incident beam through the tilt correcting prism 40 is as follows.

$$\xi = \sin^{-1}(\sin\eta / n_{25}) \qquad (3)$$

In this example, the apical angle of tilt correcting prism 40 is set to the same angle as the refraction angle $\xi$. By this, the beam entering the entrance surface 40a along the optical axis AX3B and outgoing from the exit surface 40b becomes perpendicular to the exit plane 40b. Accordingly, taking into consideration a rise of image by the tilt correcting prism 40, a tilting angle $\rho$, which is an angle of inclination of a relayed image plane of the exposed surface of wafer 1 relative to a plane perpendicular to the beam outgoing perpendicular to the exit surface 40b, is as follows.

$$\rho = \tan^{-1}(\tan\rho / n_{25}) \qquad (4)$$

Supposing the magnification of relay optical system 44–48 is 1, the tilting angle $\rho$ itself is an angle between the light-receiving surface 50a of photoelectric detector 50 and a plane perpendicular to the exit-side optical axis AX4B of relay optical system 44–48, i.e., the angle of incidence of principal rays into the light-receiving surface 50a.

For example, if the index of refraction $n_{25}$ is 1.8 and the incidence angle $\eta$ into the entrance surface 40a of tilt correcting prism 40 is 80.1°, the tilting angle $\rho$ is 20.0°. Thus, the tilting angle $\rho$ is close to 0°. Also, the incidence angle of principal rays into the light-receiving surface 50a of photoelectric detector 50 is 20.0°, so that the entrance angle of this extent can be considered to cause almost no reduction in light-receiving amount. As described above, the present example employs the tilt-correcting prism 40 as the deflecting optical system, so that the incidence angle of beam onto the light-receiving surface 50a can be smaller, which can prevent the reduction in light-receiving amount on the photodetectors D1–D5 located on the light-receiving surface 50a.

Further, it is preferable that the Scheimpflug relation is satisfied between the entrance surface 40a of tilt correcting prism 40 and the light-receiving surface 50a of photoelectric detector 50 with respect to the relay optical system 40–48. Also, in case of the light source 14 in FIG. 1 having a broad wavelength band, a prism such as the tilt correcting prism 40 is preferably used as the deflecting optical system, but a diffraction grating may also be employed as the deflecting optical system. If a diffraction grating is employed, dispersion of the deflected beam is increased as compared with the case of the prism being used, and therefore the numerical aperture of relay optical system 44–48 must be increased.

In case the incidence angle $\eta$ of the beam along the optical axis AX3B into the entrance surface 40a is large, the transmittance of the beam passing through the tilt correcting prism 40 becomes greatly different between p-polarized light and s-polarized light. For example, if the incidence angle $\eta$ is 80° and the index of refraction $n_{25}$ of the tilt correcting prism 40 is 1.8, the transmittance of p-polarized light component is 0.79 and that of s-polarized light component 0.37. Since the transmittance in the tilt correcting prism 40 differs depending upon the state of polarization of incident beam as described, a weight of information in each polarization component is different from another, which could cause an error in position detection of exposed surface of wafer 1. Then the present example is so arranged, as shown in FIG. 1, that the half wave plate 38 is interposed in the optical path between the converging optical system 32–36 and the tilt correcting prism 40 and a beam rotated 45° in direction of polarization by the half wave plate 38 is made incident into the tilt correcting prism 40. By this arrangement, a beam incident into the tilt correcting prism 40 is a mixture of p-polarized light and s-polarized light, whereby the position detection is accurately conducted for the exposed surface of wafer 1.

A quarter wave plate may be employed in place of the half wave plate 38. In case of a quarter wave plate being employed, a beam incident into the tilt correcting prism 40 is circularly polarized light, whereby the position detection of the exposed surface of wafer 1 can be accurately done similarly as in the case of the half wave plate 38.

Further, it is preferable that the exit surface 40b of tilt correcting prism 40 is approximately perpendicular to the beam outgoing from the exit surface 40b. Unless the exit surface 40b is approximately perpendicular to the beam outgoing therefrom, aberrations such as the astigmatism would occur in relaying an image on the entrance surface 40a by the relay optical system 44–48.

In FIG. 1, the vibrating mirror 34 is interposed in the optical path of the converging optical system 32–36. A mirror drive unit 54 vibrates the vibrating mirror 34 at a predetermined period T in a predetermined direction, based on a signal from an internal oscillator. The vibration of vibrating mirror 34 also vibrates the grating pattern image formed on the light-receiving slit plate 42 on the entrance surface 40a of tilt correcting prism 40. An example of the vibration direction of the grating pattern image is an R2 direction intersecting at a counterclockwise angle (π/2-Φ) with the X2 direction in FIG. 6 conjugate with the X direction in FIG. 1. Also, the R2 direction is a direction conjugate with the R1 direction in which the grating pattern 28 on the grating pattern plate 20 as shown in FIG. 4 is arranged. Namely, the vibration direction R2 of the grating pattern image by the vibrating mirror 34 is the direction in which the bright portions and dark portions in the grating pattern image projected onto the light-receiving slit plate 42 are arranged. As described later, the vibration direction of grating pattern image by the vibrating mirror 34 is not necessarily taken in the R2 direction.

In this case, supposing P' is the pitch in the R2 direction of the grating pattern image formed on the light-receiving slit plate 42, the width $W_{si}$ in the R2 direction, of each aperture S1–S5 on the light-receiving slit plate 42 preferably satisfies the following relation.

$$W_{si} \leq P' \quad (5)$$

It is also preferable that the amplitude $A_{si}$ in the R2 direction, of the grating pattern image vibrated by the vibrating mirror 34 satisfies the following relation.

$$A_{si} \leq P' \quad (6)$$

Here, if the width $W_{si}$ in the R2 direction of aperture S1–S5 does not satisfy the condition of formula (5) or if the amplitude $A_{si}$ in the R2 direction of grating pattern image does not satisfy the condition of formula (6), a change in quantity of light becomes small at the apertures S1–S5 upon vibration of the vibrating mirror 34, which unpreferably lowers the detection accuracy.

The apertures S1–S5 are so arranged that when the exposed surface of wafer 1 is substantially coincident with the image-forming plane of projection optical system 2, the center of each aperture S1–S5 is coincident with the vibration center of a bright portion in the grating pattern image. As the grating pattern image vibrates in the R2 direction on the light-receiving slit plate 42 in accordance with the vibration of the vibrating mirror 34, an amount of receiving light changes on the photodetectors D1–D5 in FIG. 7. The photodetectors D1–D5 supply detection outputs according to respective quantities of receiving light to the detection unit 52. These detection outputs each are an AC signal in the same phase as the vibration period T of the vibrating mirror 34.

The detection unit 52 performs synchronous rectification (synchronous detection) of the detection outputs from the photodetectors D1–D5 with reference to the phase of AC signal of period T generated by the mirror drive unit 54, and supplies obtained detection output signals (as will be called totally as "detection output signal FS") to a correction amount calculating unit 56. The detection output signal FS is a signal changing in proportion with a displacement of a measurement point in the Z direction within a predetermined range, which becomes zero when a corresponding measurement point (the measurement point M1–M5 in FIG. 5) is on the image-forming plane of projection optical system 2, positive when the measurement point is located above the image-forming plane, and negative when the measurement point is located below the image-forming plane. Accordingly, the correction amount calculating unit 56 can calculate from the detection output signal FS a Z-directional position (focus position) of each measurement point M1–M5 in the shot area 1a on the exposed surface of wafer 1.

The correction amount calculating unit 56 calculates an average plane inclination of the surface of shot area 1a and for example a focus position of the center point of shot area 1a from the focus positions of measurement points M1–M5 in the shot area 1a. Further, the correction amount calculating unit 56 calculates a correction amount of inclination by which the shot area 1a can be aligned with the image-forming surface of projection optical system 2 within the range of depth of focus, and a correction amount of position in the focus direction, and supplies these correction amounts to the drive unit 10 in FIG. 1.

The drive unit 10 drives the wafer stage 8 based on the supplied correction amount of inclination to perform leveling of the wafer holder 6. Further, the drive unit 10 drives the wafer holder 6 based on the supplied correction amount of position in the focus direction to position the exposed surface of wafer 1 in the focus direction. After the leveling and focusing are performed for the shot area 1a on the exposed surface of wafer 1 as described above, an image of the circuit pattern on the reticle R is focused or projected on the shot area 1a.

Next described are the arrangement of optical systems in the surface position detecting apparatus in this embodiment, and a relation between the grating pattern image projected on the shot area 1a in wafer 1 and the shape of shot area 1a.

Figure 8:
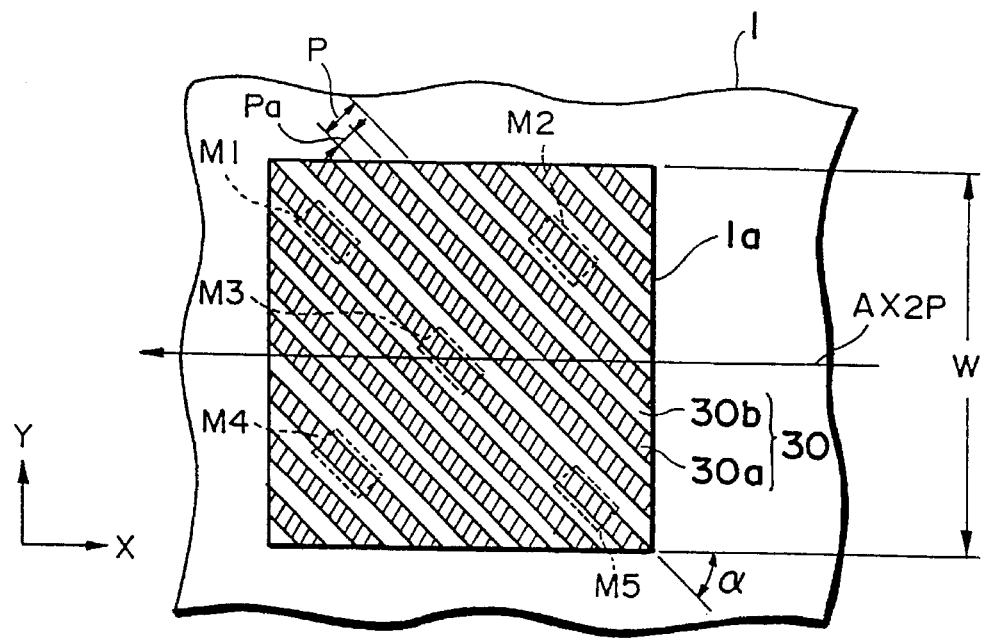
FIG. 8 is a plan view to show a pattern image projected on a shot area in an exposed surface of wafer.

In the present embodiment, as shown in FIG. 5, the grating pattern image 30 is projected on the rectangular shot area 1a in the exposed surface of wafer 1 in such a pattern that the dark portions 30a and bright portions 30b are obliquely and alternately arranged along the optical axis AX2 of irradiation optical system. FIG. 8 is a plan view of the shot area 1a. As shown in FIG. 8, the X axis and Y axis are taken in parallel with the contour of the rectangular shot area 1a, and the grating pattern image 30 is projected on the shot area 1a in such a state that the dark portions 30a and bright portions 30b extending in the direction intersecting at a clockwise angle α with the X axis are arranged at the pitch P in the direction perpendicular thereto. This angle α can be defined as an angle α between a direction in which the grating image 30 is displaced when the wafer 1 is vertically moved, and a longitudinal direction of the grating pattern image 30. The width Pa of dark portions 30a is approximately a half of the pitch P. Also, the five measurement points M1–M5 are located near the four corners in the diagonal directions in the shot area 1a and at the center, as shown by the dotted lines in FIG. 8.

Figure 9:
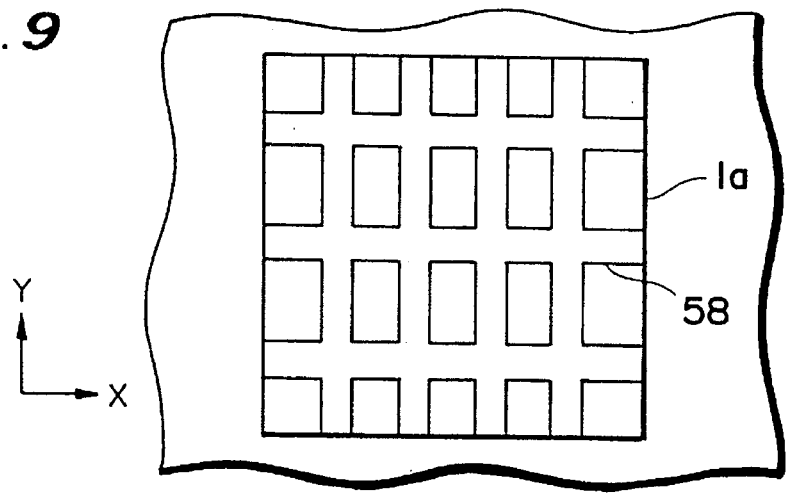
FIG. 9 is a plan view to show a circuit pattern formed in a shot area of wafer.

FIG. 9 shows a circuit pattern 58 already formed in the shot area 1a. The circuit pattern 58 is composed mainly of patterns parallel to the contour of shot area 1a, that is, patterns arranged in a parallel relation to the X axis or Y axis. In this case, in order to reduce the influence on the position detection of circuit pattern 58, the angle α between the circuit pattern 58 and the longitudinal direction of the bright portions 30b or the dark portions 30a in the grating pattern image 30 projected thereon is preferably in the range of from greater than 0° to less than 90°, more preferably about 45°The angle α may be another angle other than 45°, depending upon the direction of circuit pattern 58.

Figure 10:
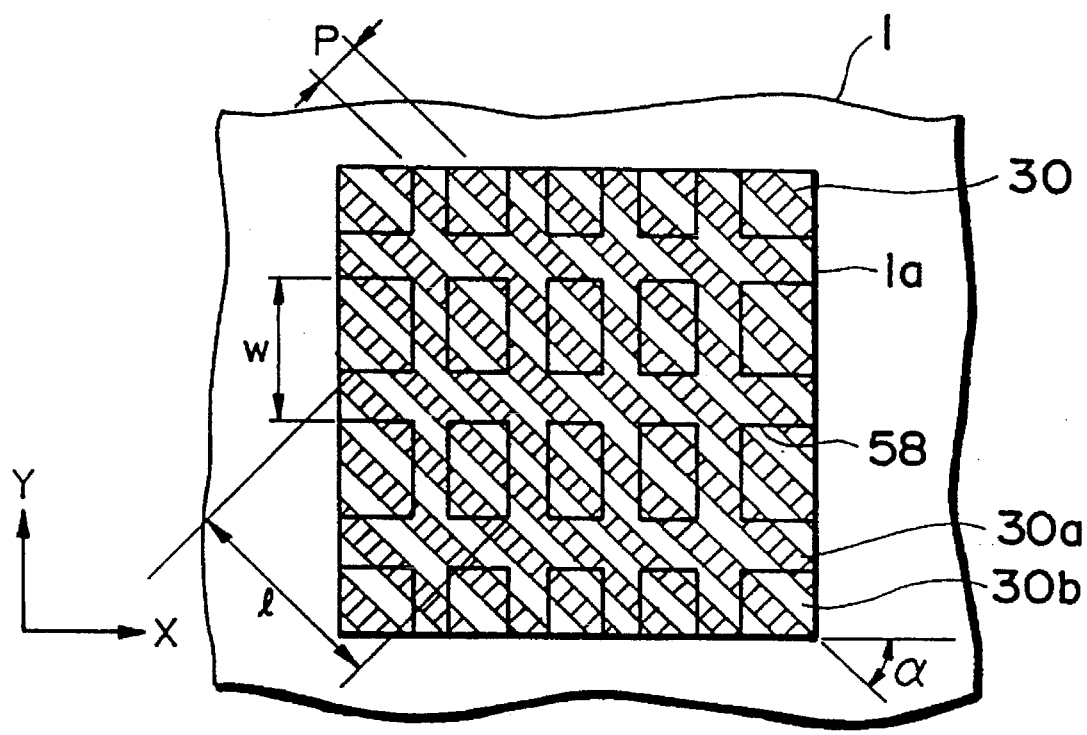
FIG. 10 is a superposition of FIG. 8 and FIG. 9.

FIG. 10 is a superposition of FIG. 8 and FIG. 9. Referring to FIG. 10, consideration is given to the inclination angle α of the grating pattern image 30. In the drawing, w represents a pitch of the circuit pattern (ground pattern) 58 along the Y direction and 1 a pitch of the circuit pattern 58 along the longitudinal direction of the grating pattern image 30, which is a pitch of circuit pattern 58 on the light-receiving surface 50a of photoelectric detector 50.

It is evident from FIG. 10 that the following relation holds.

$$\sin\alpha = w/l \quad (7)$$

In order to suppress the influence of circuit pattern 58, it is to be desired that the image of circuit pattern 58 on the light-receiving surface 50a has a pitch as fine as possible. It is thus preferable that the following relation is satisfied.

$$l \leq P \quad (8)$$

Accordingly, the following relation is obtained from formula (7) and formula (8).

$$\sin\alpha \geq w/P \quad (9)$$

For example, if w=100 μm and P=500 μm, α is at least 11.5°. Therefore, the angle α is preferably in the range of from about 10° to about 80°.

It should, however, be noted that w=100 μm is a typical pitch of circuit pattern and the angle α varies depending upon the resolution of photoelectric detector.

Returning to FIG. 8, the axis AX2P parallel to the X axis is an axis obtained by projecting the optical axis AX2 of irradiation optical system 22, 24 in FIG. 1 onto the wafer 1, and the axis AX2P is the same axis as one obtained by projecting the optical axis AX3A of the converging optical system 32–36 in FIG. 1 onto the wafer 1. Further, the axis AX2P is also an intersecting line between the exposed surface of wafer 1 and a plane including the optical axis AX2 of irradiation optical system 22, 24 and the normal line to the exposed surface of wafer 1 or an intersecting line between the exposed surface of wafer 1 and a plane including the optical axis AX3A of converging optical system 32–36 and the normal line to the exposed surface of wafer 1. Calling the irradiation optical system 22, 24 and the converging optical system 32–36 in FIG. 1 collectively as a detection optical system, the axis AX2P obtained by projecting the optical axis of the detection optical system is parallel to the X axis parallel to a side of shot area 1a in the present example.

As shown in FIG. 4 previously described, the angle is Φ between the longitudinal direction of light-shielding portions 28a and light-transmitting portions 28b in the grating pattern 28 formed on the grating pattern plate 20, and the X1 direction conjugate with the X axis. In this case, since the imaging relation of tilting holds, the angle Φ can be expressed as follows using the lateral magnification $\beta_4$ from the grating pattern plate 20 to the exposed surface of wafer 1, the incident angle θ of principal rays of illumination light onto the exposed surface of wafer 1, and the intersecting angle α in FIG. 8.

$$\tan\phi = \frac{\tan\alpha}{\sqrt{\cos^2\theta + \beta_4^2 \sin^2\theta}} \quad (10)$$

For example, if the incident angle θ is 75°, the lateral magnification $\beta_4$ is 2 and the angle α is 45°, the angle Φ becomes 36°.

FIG. 6 shows that the aligning direction of the apertures S5, S3, S1 on the light-receiving slit plate 42 intersects at the angle Φ with the X2 direction conjugate with the X axis. This represents a case where the magnification of irradiation optical system 22, 24 is equal to that of the converging optical system 32–36. Further, the direction intersecting at the angle Φ with the X2 direction is also the longitudinal direction of each aperture S1–S5.

Figure 11:
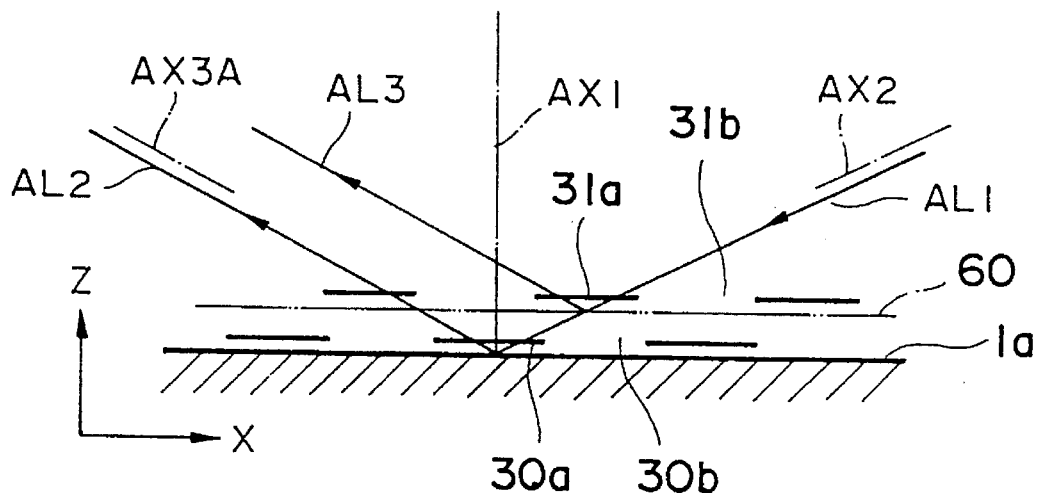
FIG. 11 is an enlarged cross sectional view of a surface of wafer to illustrate a displacement of a grating pattern image with a Z-directional displacement of surface of shot area.

Next, FIG. 11 is an enlarged view of FIG. 5 as seen along the Y direction. In FIG. 11, the grating pattern image is projected onto the shot area 1a in the exposed surface of wafer 1 such that cross sections of dark portions 30a and bright portions 30b are arranged at the predetermined pitch (=P/sinα) in the X direction. In this case, after the beam AL1 incident along the optical axis AX2 is reflected by the shot area 1a, it advances along the optical axis AX3A as a beam AL2. If the shot area 1a is displaced up to a position 60 in the Z direction, the incident beam AL1 is reflected by the surface at the position 60 to travel as a beam AL3. Accordingly, the dark portions 30a and bright portions 30b are displaced up to respective positions 31a and 31b in the X direction. For example, in case of FIG. 8, the displacement direction of grating pattern image 30 according to the focus position of each measurement point M1–M5 in the shot area 1a is a direction parallel to the axis AX2P.

A direction on the light-receiving slit plate 42 in FIG. 1 conjugate with the displacement direction of the grating pattern image is the X2 direction in FIG. 6, and the measurement direction R2 of the grating pattern image intersects at the angle (π/2-Φ) with the displacement direction of grating pattern image. Accordingly, the detection sensitivity to the displacement of grating pattern image is cos(π/2-Φ), i.e., sinΦ. Since the angle Φ is about 45° in this example, lowering of sensitivity is substantially trivial.

Since an actually measured amount is a horizontal shift amount in the R2 direction between the grating pattern image and the apertures S1–S5 on the light-receiving slit plate 42, the vibration direction of the grating pattern image by the vibrating mirror 34 may be arranged as coincident with the displacement direction (X2 direction) of the grating pattern image. In case the vibration direction of grating pattern image is taken in the X2 direction as described, the rotational axis of the vibrating mirror 34 in FIG. 1 can be set perpendicular to a plane including the optical axis AX2 of irradiation optical system 22, 24 and the normal line to the exposed surface of wafer 1, i.e., perpendicular to the plane of FIG. 1, which is simple in structure.

In this example, as seen from formula (10), as the imaging magnification (lateral magnification) $\beta_4$ in the direction perpendicular to the optical axis AX2 onto the exposed surface (detected surface) of wafer 1 becomes smaller, the angle Φ on the light-receiving slit plate 42 decreases, so that the detection sensitivity (sinΦ) is little lowered.

Figure 12:
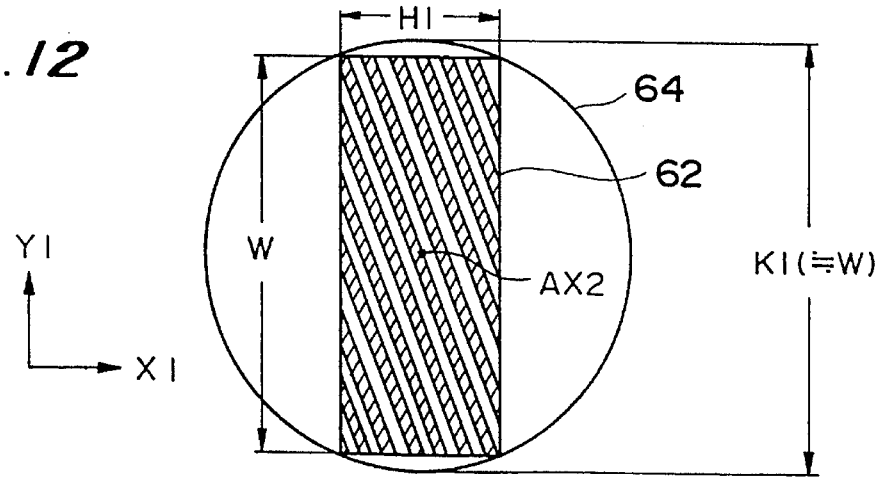
FIG. 12 is a drawing to show an image observed when a grating pattern image on a shot area is seen along the direction of the optical axis of an irradiation optical system in FIG. 1.

Further, because in this example, as shown in FIG. 8, the longitudinal direction of grating pattern image 30 intersects at the angle α with the axis AX2P as the projected optical axis AX2 of irradiation optical system 22, 24, the axis AX2P is parallel to the X direction extending along a side of shot area 1a. In this case, let the incident angle θ onto the exposed surface of wafer 1 be 80° and the lateral magnification $\beta_4$ of irradiation optical system 22, 24 be 1. Further, suppose the shot area 1a is square with the width W. Then, when the grating pattern image 30 on the exposed surface of wafer 1 is seen along the direction of the optical axis AX2 of irradiation optical system 22, 24 in FIG. 1, an image 62 is observed with a width H1 ($\approx \cos\theta \cdot W \approx 0.17 \cdot W$) in the X1 direction conjugate with the X direction and a width W in the Y1 direction conjugate with the Y direction, as shown in FIG. 12. Accordingly, a diameter K1 of a smallest lens 64 in the irradiation optical system 22, 24 is about W.

Figure 13:
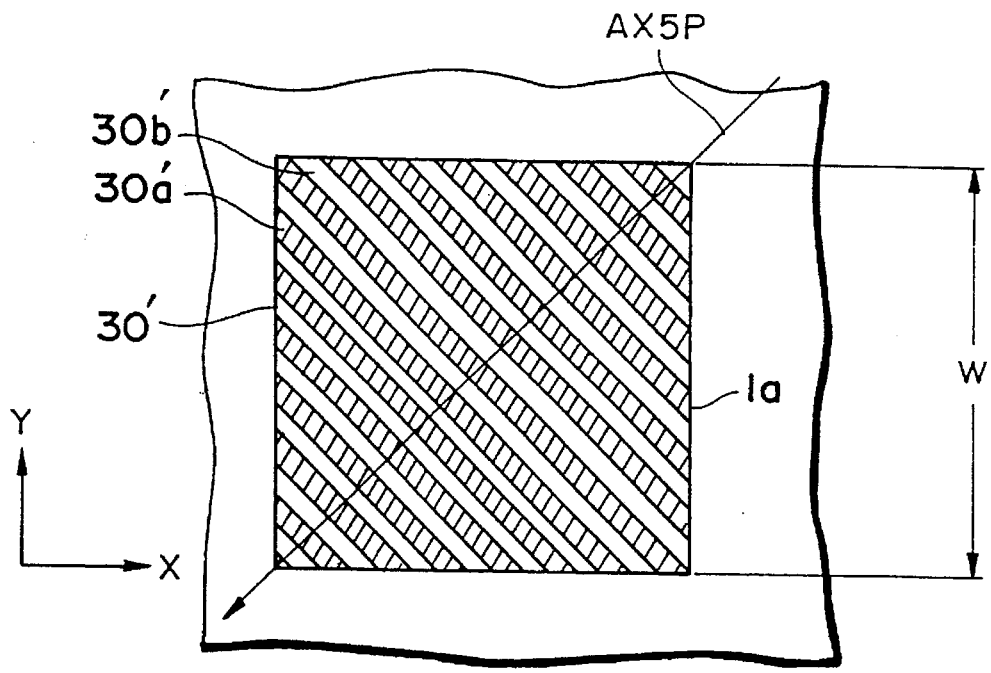
FIG. 13 is a plan view to show a relation between a grating pattern image projected on a shot area in wafer and the optical axis of irradiation optical system in a conventional example.
Figure 14:
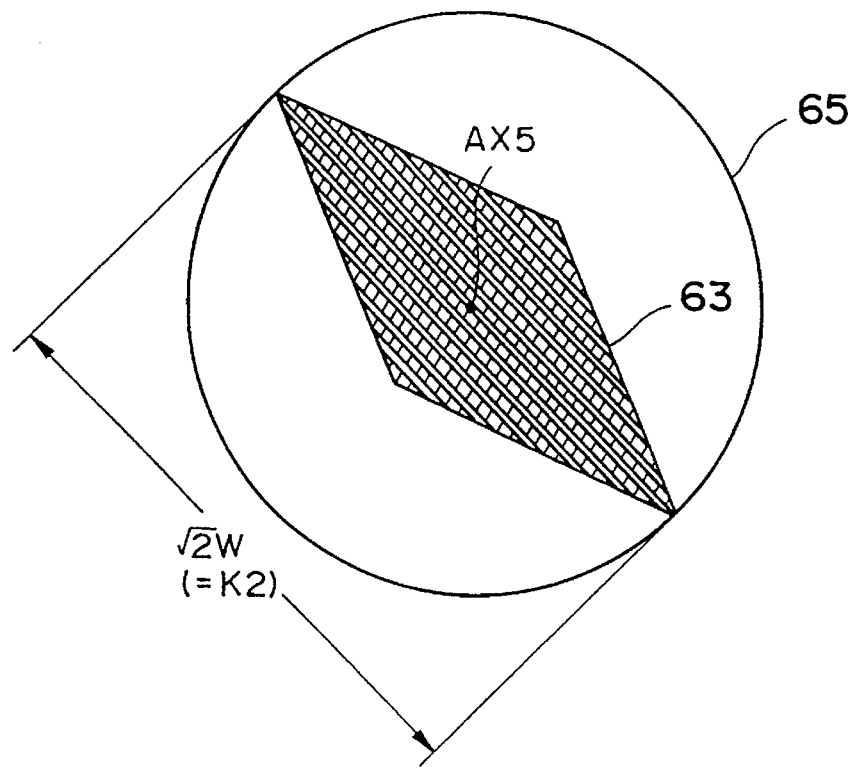
FIG. 14 is a drawing to show an image observed when a grating pattern image on a shot area is seen along the direction of the optical axis of an irradiation optical system in the conventional example.

In contrast, the conventional example is so arranged, as shown in FIG. 13, that the axis AX5P as the projected optical axis of irradiation optical system onto the wafer 1 is set in parallel with the arrangement direction (pitch direction) of the grating pattern image 30' projected on the shot area 1a. Thus, in case the longitudinal direction of grating pattern image 30' is set in the direction intersecting at 45° with the X direction and the Y direction parallel to the contour of square shot area 1a with the width W, the axis AX5P intersects at 45° with the X axis and Y axis. Then, when the grating pattern image 30' on the exposed surface of wafer is observed in the direction of the optical axis AX5 of irradiation optical system in the conventional example, an image 63 is observed with a width $2^{1/2} \cdot W$ in the direction conjugate with the direction intersecting at 45° with the X axis and a width $\cos\theta \cdot 2^{1/2} \cdot W$ ($\approx 0.24 \cdot W$) in the direction orthogonal thereto, as shown in FIG. 14. Accordingly, a diameter K2 of a smallest lens 65 in the irradiation optical system in the conventional example is about $2^{1/2} \cdot W$.

In summary, the present example can reduce the minimum diameter (effective diameter ) K1 of irradiation optical system 22, 24 to about $\frac{1}{2}^{1/2}$ of the minimum diameter (effective diameter) K2 in case of the conventional example being employed. Therefore, the volume of the entire optical systems in the surface position detecting apparatus can be reduced to about $\frac{1}{2}^{3/2}$ ($\approx \frac{1}{2} \cdot 8$) as compared with that in the conventional example, which permits mechanical portions in the apparatus to be constructed in a smaller size.

Although the above embodiment employed the vibrating mirror 34 for detecting a displacement of a pattern projected onto the exposed surface of wafer 1, this can be done by image processing using for example a two-dimensional CCD as the photoelectric detector. If the position detection is performed by such an image processing method, as detailed later, in FIG. 1 the vibrating mirror 34 is simply replaced by a fixed plane mirror, and, removing the light-receiving slit plate 42, the two-dimensional CCD is set as the photoelectric detector. Then an image picked up by the two-dimensional CCD is processed to detect a horizontal shift amount of streaks in the grating pattern at each measurement point on the shot area 1a of wafer 1, and a focus position of each measurement point on the shot area 1a is obtained from the horizontal shift amount.

The above embodiment showed an example in which the pattern plate 20 was used for irradiation of pattern 28 including the transmitting portions 28b and shielding portions 28a periodically formed as shown in FIG. 4 and in which, as shown in FIG. 8, the image of pattern plate 20 was projected over the entire surface of rectangular shot area 1a in the exposed surface of wafer 1, but five slit (linear) patterns may be projected onto portions corresponding to the five measurement points M1–M5 (see FIG. 8), for example. In this case, the pattern plate 20 as shown in FIG. 4 may be replaced by a pattern plate 70, as shown in FIG. 15, in which five slit (linear) apertures $72_1$–$72_5$ are formed in a light-shielding member as corresponding to the measurement points M1–M5. Alternatively, using as the irradiation pattern plate a pattern plate with five light-shielding slits (lines) formed corresponding to the measurement points M1–M5 in an optically-transparent plane-parallel plate, dark patterns may be projected onto the square shot area 1a.

Although the above description concerned the example in which the five measurement points were taken on the rectangular shot area 1a in the exposed surface of wafer 1, the measurement points may be more than five. For example, the slit (linear) apertures ($70_1$–$70_5$) shown in FIG. 15 may be formed in the number more than five. In order to detect more than five measurement points, the light-receiving slit plate 42 shown in FIG. 6 is preferably so arranged that it has apertures of more than five for extracting measurement light at portions corresponding to the measurement points and the photoelectric detector 50 shown in FIG. 7 has photodetectors of more than five for independently detecting light passing through the light-receiving slit plate 42. It is also possible that the light-receiving slit plate 42 having the more than five apertures is removed, the vibrating mirror 34 is replaced by a simple plane mirror, and a two-dimensional CCD is employed as the photoelectric detector 50.

Also, the example in FIG. 15 is so arranged that in case the pattern on the rectangular shot area 1a can be assumed to have two-dimensional directionality along the orthogonal XY directions as shown in FIG. 9, all apertures ($70_1$–$70_5$) in the irradiation pattern plate 70 are inclined at Φ to the displacement direction X1 of pattern so that the direction of slit (line) pattern image (the longitudinal direction of slit (line) pattern image) projected on the rectangular shot area 1a is made different from (or not parallel with) the X direction and the Y direction. However, if the directionality of two-dimensional pattern in the rectangular shot area 1a is locally different between the measurement points (M1–M5) one from another, the inclination of each aperture ($70_1$–$70_5$) in the irradiation pattern plate 70 in the displacement direction X1 of pattern should be preferably determined depending upon the direction of two-dimensional pattern of a measured object at each measurement point (M1–M5) so that the direction of the two-dimensional pattern of measured object at each measurement point (M1–M5) is different from the direction of projected slit (line) pattern image.

As an example, in a case where a two-dimensional pattern at the peripheral portion of rectangular shot area 1a has the directionality along the orthogonal X and Y directions (see FIG. 9) but a two-dimensional pattern in the central portion of rectangular shot area 1a has directionality along directions different from the orthogonal X and Y directions (FIG. 9), such an arrangement should be preferably employed that an aperture $70_3$ located in the central portion of irradiation pattern plate 70 is formed at an inclination Φ' different from an inclination Φ of peripheral apertures $70_1$, $70_2$, $70_4$, $70_5$, as shown by the dotted line in FIG. 15, so as to change a direction of a slit (line) pattern image projected at the measurement point M3 corresponding to the central portion of rectangular shot area 1a.

Here, it is preferable to determine the inclination of each aperture in the light-receiving slit plate 42 as shown in FIG.

6 relative to the displacement direction X2 of pattern, and the inclination of each photodetector in the photoelectric detector 50 as shown in FIG. 7 relative to the displacement direction X3 of pattern in correspondence with the inclination of each aperture in the irradiation pattern plate 70 relative to the displacement direction X1 of pattern. It is also possible that the light-receiving slit plate 42 with a plurality of apertures is removed, the vibrating mirror 34 is replaced by a simple plane mirror, and a two-dimensional CCD is employed as the photoelectric detector 50.

It is also possible for measuring a plurality of detected objects having mutually different patterns that a first irradiation pattern plate having a plurality of apertures and a second irradiation pattern plate different in the longitudinal direction of at least one aperture from the first projection pattern plate are interchangeably arranged in the irradiation optical path, so as to optimize the direction of slit image projected according to the directionality of two-dimensional pattern at each measurement point on a detected object. In this case, if a two-dimensional CCD is used as the photoelectric detector 50, the light-receiving slit plate 42 having a plurality of apertures is removed, and the vibrating mirror 34 is replaced by a simple plane mirror, the structure of detection system can be advantageously simplified.

Also, each irradiation pattern plate can be constructed as integral with the deflecting prism (the prism 18 in FIG. 1). In this case, each irradiation pattern plate is preferably arranged as integrally interchangeable together with the deflecting prism.

Furthermore, the irradiation pattern plate 20 may be arranged as rotatable. Namely, it is preferred that the pattern plate 20 is set in parallel with the exit plane of deflecting prism 18 in front thereof and is made rotatable about a certain axis normal to the exit plane. In this case, a rotation of pattern plate 20 can properly change the angle Φ between the direction of grating pattern 28 on the grating pattern plate 20 and the X1 direction conjugate with the X axis. Accordingly, the angle Φ can be set as suitable for the ground pattern of wafer 1 whereby the detection accuracy can be improved. In this case, it is of course necessary that the light-receiving slit plate 42 and the photoelectric detector 50 be also rotatably arranged so that the inclination of each aperture in the slit plate 42 relative to the displacement direction X2 and the inclination of each photodetector in the photoelectric detector 50 relative to the displacement direction X3 can match with the angle Φ. It is also possible that a two-dimensional CCD is employed as the photoelectric detector 50, the light-receiving slit 42 is removed and the vibrating mirror 34 is replaced by a simple fixed plane mirror.

Although the above embodiment is so arranged that a plane formed by the optical axis AX2 of irradiation optical system 22, 24, the optical axes AX3A, AX3B of converging optical system 32–36 and the optical axes AX4A, AX4B of relay optical system 44–48 is parallel to the X axis, these optical axes do not have to be made parallel to the X axis, as long as the axes are not parallel to the arrangement direction (pitch direction) of the grating pattern image 30 projected on the wafer 1. Since the conventional apparatus is so arranged that the arrangement direction of grating pattern image 30 on the surface of wafer 1 is parallel to the plane formed by the optical axes AX2, . . . of projection optical system 22, 24, . . . and the normal line to the surface of wafer 1, there are restrictions on the arrangement of optical systems of apparatus components used in position detection. The present invention circumvents the restrictions. Therefore, the present invention permits the apparatus to be constructed in a smaller size.

As previously described, it is possible in the present invention that the photoelectric detector 50 is replaced by a two-dimensional scanning image-pickup device, for example a two-dimensional charge-coupled image-pickup device (two-dimensional CCD). The following description concerns the second embodiment using a two-dimensional CCD, with reference to FIG. 16 to FIG. 19.

Figure 16:
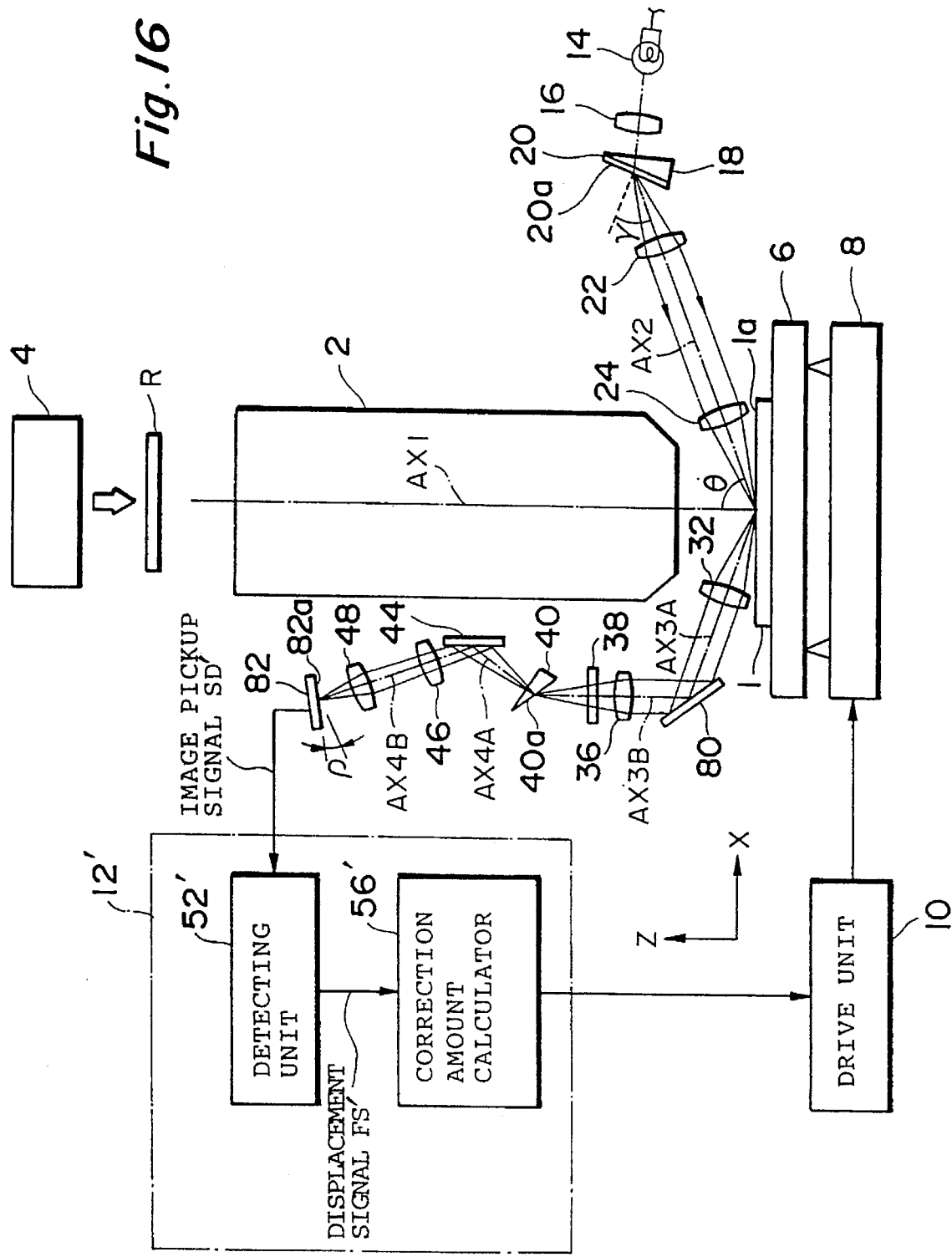
FIG. 16 is a schematic drawing to show the structure of a projection exposure apparatus to which the second embodiment of the present invention is applied.

A surface position detecting apparatus of the second embodiment as shown in FIG. 16 is substantially the same as the embodiment of FIG. 1 except that the vibrating mirror 34 in FIG. 1 is replaced by a fixed plane mirror 80, that the slit plate 42 is eliminated, and that the photoelectric detector 50 is replaced by a two-dimensional CCD 82. Accordingly, same or equivalent portions as those in FIG. 1 are denoted by the same reference numerals and detailed description therefor will be omitted.

As shown in FIG. 16, light emitted from a light source is converted into a beam of nearly parallel rays by a condenser lens 16 to enter a deflecting prism 18. The light passes through a grating pattern plate 20 on the exit side of deflecting prism 18, and passes through an irradiation optical system 22, 24 to form an image of grating pattern of the grating pattern plate 20 on a shot area 1a in wafer 1. Further, the light projected onto the wafer 1 is reflected there then to enter a converging objective lens 32 in a converging optical system, and is then reflected by a plane mirror 80 to pass thereafter through a condenser lens 36 and a half wave plate 38 to enter a tilt correcting prism 40. The grating pattern image projected on the wafer 1 is re-imaged on the entrance surface 40a of the prism 40. A beam outgoing from the tilt correcting prism 40 is reflected by the plane mirror 44, thereafter passes through a first relay lens 46 and a second relay lens 48, and then forms a further conjugate image of the grating pattern image formed on the entrance surface 40a of tilt correcting prism 40, on an image-pickup surface 82a of two-dimensional CCD 82.

Figure 17:
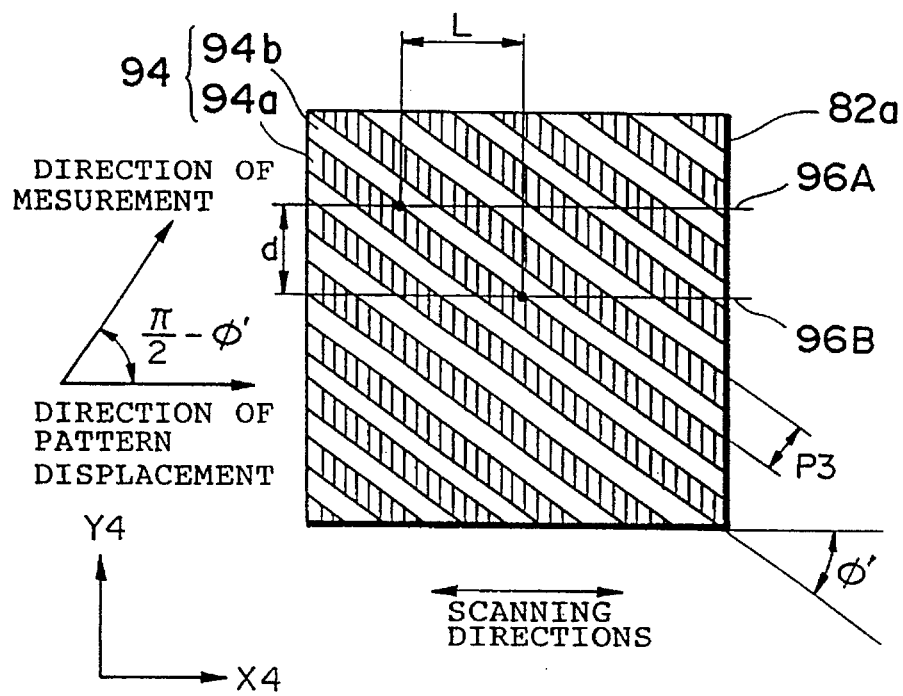
FIG. 17 is a drawing to show a measurement pattern image formed on an image pickup surface of two-dimensional CCD in FIG. 16.

FIG. 17 shows the image pickup surface 82a of two-dimensional CCD 82 in FIG. 16. In FIG. 17, an X4 direction and a Y4 direction are taken along directions on the image pickup surface 82a of two-dimensional CCD 82 conjugate with the X direction and the Y direction on the wafer 1 shown in FIG. 8, respectively. The two-dimensional CCD 82 in this example has a number of pixel series aligned in parallel with the X4 direction, and the scanning direction, which is a direction to read a photoelectrically converted signal (hereinafter referred to as "image pickup signal") SD' of each pixel, is set in parallel with the X4 direction. Also, the image pickup surface 82a of two-dimensional CCD 82 is rectangular with sides parallel to the X direction and the Y direction. Formed on the image pickup surface 82a is a grating pattern image 30 including dark portions 30a and bright portions 30b at pitch P3 in a direction intersecting at a counterclockwise angle ($\pi/2$-Φ'), as detailed later, with the X4 direction. Therefore, the measurement direction is the pitch direction, and the image pickup signal SD' read from the two-dimensional CCD 82 is supplied to a detecting unit 52' in a control unit 12' in FIG. 16.

Here, the two-dimensional CCD 82 may be replaced by a MOS image sensor or an image pickup tube.

Figure 18:
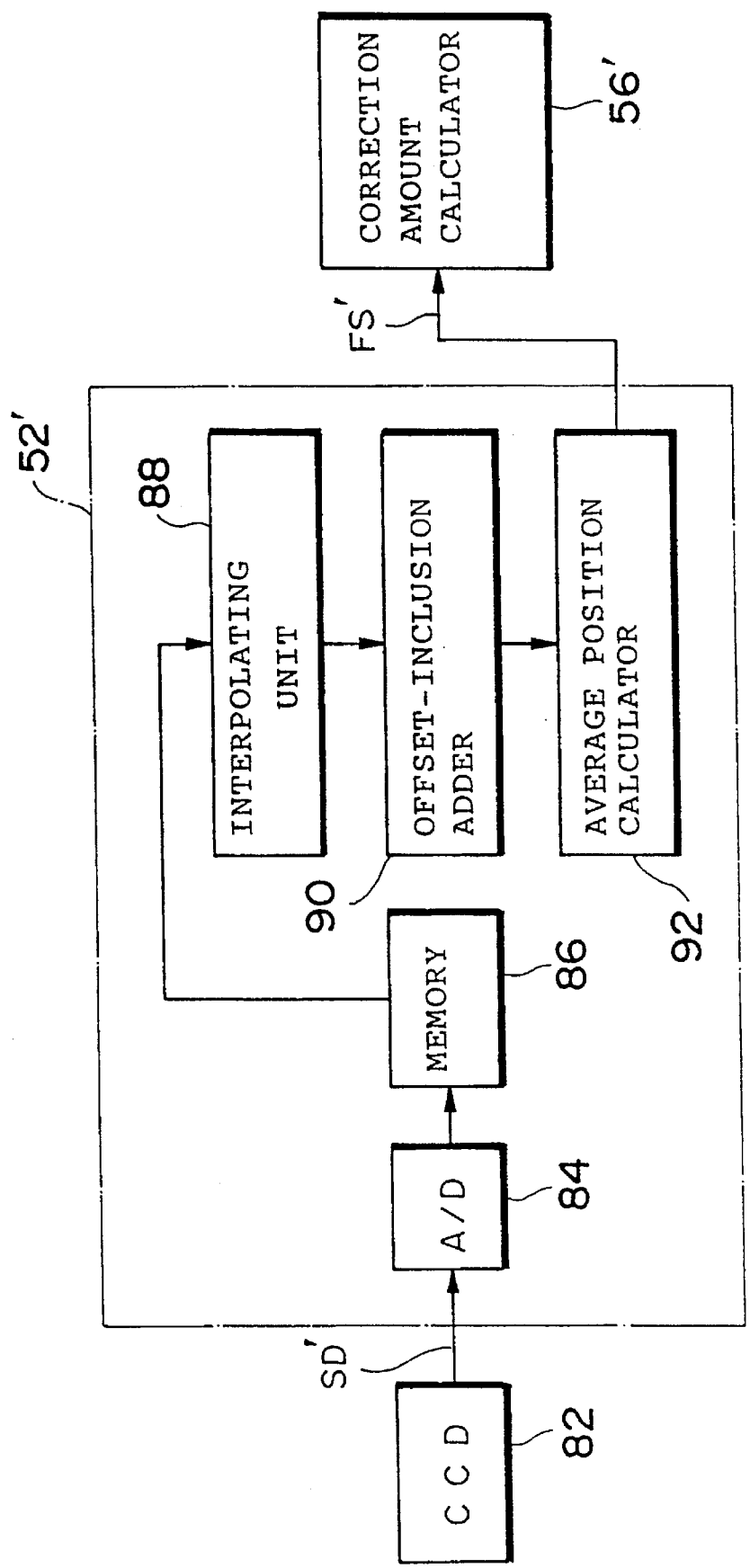
FIG. 18 is a block diagram to show the structure of a control unit in FIG. 16 with respect to functions thereof.

FIG. 18 shows an example of construction of the detecting unit 52' in this second embodiment. In FIG. 18, image pickup signals SD' are successively stored through an analogue/digital (A/D) converter 84 in a memory 86. Then an interpolating unit 88 reads out of the memory 86 the image pickup signals corresponding to fine regions (measurement points) on a detected surface as an object for displacement detection, and the interpolating unit 88 executes interpolation of the thus read image pickup signals. Image pickup signals output from the interpolating unit 88 are successively added with inclusion of a predetermined delay time (as detailed later) in an offset-inclusion adding unit 90. The addition signal is supplied to an average position calculator 92. The average position calculator 92 obtains a phase of the supplied addition signal for example by the Fourier transformation and compares the phase with a reference phase preliminarily set to produce a displacement signal FS' corresponding to the deviation therebetween and to supply the obtained displacement signal FS' to a correction amount calculator 56'.

The displacement signal FS' is zero when a corresponding fine region (measurement point) on the detected surface is substantially coincident with the image plane of projection optical system 2, positive when the measurement point is located above the image-forming plane, and negative when the measurement point is located below the image-forming plane, which is a signal changing in proportion with a displacement of measurement point in the Z direction within a predetermined range. Accordingly, the correction amount calculator 56' can calculate a position (focus position) in the Z direction, of an arbitrary (within the range determined by the resolution of two-dimensional CCD 82) measurement point in the shot area 1a on the exposed surface of wafer 1, from the displacement signal FS'.

The correction amount calculator 56' calculates an average plane inclination of the surface of shot area 1a and for example a focus position of the center point of shot area 1a from focus positions of predetermined measurement points in the shot area 1a. Further, the correction amount calculator 56' calculates a correction amount of inclination for matching the shot area 1a with the image plane of projection optical system 2 within the range of depth of focus, and a correction amount of position in the focus direction, and supplies these correction amounts to the drive unit 10 in FIG. 16.

The drive unit 10 drives the wafer stage 8 based on the supplied correction amount of inclination, performing the leveling of wafer holder 6 and the focusing of wafer 1. After the leveling and focusing of shot area 1a on the exposed surface of wafer 1 are completed as described, an image of circuit pattern on reticle R is focused or projected on the shot area 1a.

The grating pattern plate 20 shown in FIG. 16 is substantially the same as the grating pattern shown in FIG. 1. Thus, referring to FIG. 4 and FIG. 8, an angle is Φ between the longitudinal direction of light-shielding portions 28a and light-transmitting portions 28b in the grating pattern 28 formed on the grating pattern plate 20, and the X1 direction conjugate with the X axis. Since the imaging relation of tilting holds in this case, the lateral magnification $\beta_4$ from the grating pattern plate 20 onto the exposed surface of wafer 1, the incident angle θ of principal rays of illumination light onto the exposed surface of wafer 1, the intersecting angle α in FIG. 5, and the angle Φ satisfy the aforementioned relation of formula (10).

For example, if the incident angle θ is 75°, the lateral magnification $\beta_4$ is 2, and the angle α is 45°, the angle Φ becomes 36°. The example of FIG. 16 is so arranged that the magnification of irradiation optical system 22, 24 is equal to that of converging optical system 32–36.

Next, in FIG. 5, when the measurement points in the shot area 1a are displaced in the Z direction (the direction normal to the plane of FIG. 5), the grating pattern image 30 is displaced in the X direction parallel to the axis AX2P. Namely, the displacement direction of pattern is the X direction.

A direction on the image pickup surface 82a of two-dimensional CCD 82 in FIG. 16 conjugate with the displacement direction of grating pattern image is the X4 direction in FIG. 17, and the longitudinal direction of grating pattern image 94 on the image pickup surface 82a intersects at angle Φ' with the X4 direction. The angel Φ' can be obtained by the same formula as formula (10).

Further, the measurement direction of grating pattern image 94, which is a direction perpendicular to the longitudinal direction of grating pattern image 94, intersects at an angle (π/2-Φ') with the displacement direction (X4 direction) of grating pattern image 94. Accordingly, the detection sensitivity to a displacement of grating pattern image 94 is cos(π/2-Φ'), i.e., sinΦ'. Thus, the lowering of sensitivity in this example is substantially trivial. Further, the present example is so arranged that the X4 direction as the displacement direction is coincident with the scanning direction of two-dimensional CCD 82. It is normally preferred that the scanning direction of two-dimensional CCD 82 is in parallel with the displacement direction of grating pattern image 94.

Figure 19:
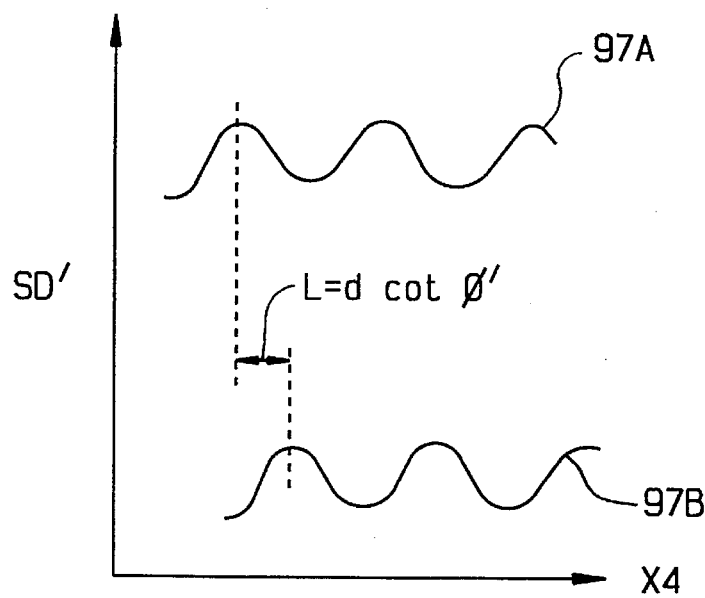
FIG. 19 is an explanatory drawing to illustrate a phase shift between image signals obtained from the tow-dimensional CCD.

The operation of detecting unit 52' in FIG. 18 is next described referring to FIG. 17 and FIG. 19. As shown in FIG. 17, the present embodiment is so arranged that the longitudinal direction of grating pattern image 94 intersects at the angle Φ' with the scanning direction on the image pickup surface 82a of two-dimensional CCD 82. Accordingly, image pickup signals obtained along two scanning lines 96A and 96B arranged in parallel with the X4 direction and at a gap d on the image pickup surface 82a show phases of streaks shifted by length L in the X4 direction. This length L is expressed as follows with the distance d and angle Φ'.

$$L = d \cdot \cot \Phi' \quad (11)$$

Image pickup signals SD' along the scanning lines 96A and 96B are shifted in the length L in phase from each other as shown by a signal 97A in FIG. 19 and a signal 97B in FIG. 19. The horizontal axis in FIG. 19 represents time t as reduced into coordinates in the X4 direction. In order to reduce the influence of noise, there are cases that image pickup signals along a plurality of scanning lines are preferably averaged. In this case, taking into consideration a phase shift corresponding to the length L, the offset-inclusion adding unit 90 in FIG. 18 adds image pickup signals while an image pickup signal of scanning line 96B is shifted by an offset corresponding to the length L relative to an image pickup signal of scanning line 96A. By this, an average image pickup signal on the scanning lines 96A and 96B can be accurately obtained.

There are also cases that the image pickup signals on the plural scanning lines do not always have to be averaged, for example as in a case where a detection region of focus position in the shot area 1a of wafer is narrow. In this case, the offset-inclusion adding unit 90 in FIG. 18 simply transmits the supplied data to the average position calculator 92. Even in this case, the reference position in obtaining a displacement of detected surface is also set considering the length (horizontal shift amount) L obtained by formula (11) in the average position calculating unit 92.

Since the present embodiment employs the two-dimensional scanning image pickup device such as the two-dimensional CCD, the measurement points on the detected surface can be arbitrarily set in number and in position, and since the longitudinal direction of slit pattern image is not parallel with the scanning direction, a displacement of detected surface can be surely detected.

As previously described, for example when a pattern 58 (ground pattern) having predetermined directionality is preliminarily formed on the detected surface, as shown in FIG. 10, and if the direction of a slit pattern image 30 projected onto the detected surface is differentiated from the direction of the pattern 58 preliminarily formed on the detected surface, influence can be reduced of the ground pattern such as IC chip pattern. However, simple differentiation of the direction of slit pattern image 30 from the ground pattern 58 on the detected surface could affect the surface position detection. For example, if the detected surface is displaced in the height direction, the position of image of the ground pattern 58 is displaced in the scanning direction of two-dimensional CCD 82.

To avoid this, for example, the direction on the two-dimensional CCD 82 corresponding to the direction of edges on the ground pattern may be made parallel to the scanning direction (X4 direction) of two-dimensional CCD 82. As a result, the length of the image of ground pattern in the scanning direction becomes longer relative to the pitch (or width) of the grating or slit pattern image in the scanning direction, and therefore they can be distinctly discriminated from each other. Accordingly, even if with a change of the surface position of detected surface the image of ground pattern is displaced in the scanning direction or in any one of directions perpendicular thereto (Y4 direction), the influence of the ground pattern can be readily removed only by correcting the direct current component on the image pickup signal, for example.

As another example, in case the direction on the two-dimensional CCD 82 corresponding to the direction perpendicular to the direction of edges on the ground pattern is parallel to the scanning direction (X4 direction) of two-dimensional CCD 82, a displacement direction of the slit pattern image on the second plane when the surface position of detected surface changes, may be first made parallel to the direction of edges of the ground pattern. As a result, even with a change of the surface position of detected surface, the image of ground pattern is displaced only in the direction perpendicular to the scanning direction, but is not changed in the scanning direction. Accordingly, the influence of the ground pattern can be readily eliminated only by correcting the direct current component in the image pickup signal, for example.

It is thought that the present invention and many of its attendant advantages will be understood from the foregoing description and it will be apparent that various changes may be made in the form, construction and arrangement thereof without departing from the spirit and scope of the invention or sacrificing all of its material advantages, the form hereinbefore described being merely a preferred or exemplary embodiment thereof.

What is claimed is:

1. A surface position detecting apparatus, which projects an image of a predetermined measurement pattern obliquely onto a surface of a plate object to be detected, which converges reflected light from the detected surface to re-image the image of said measurement pattern, and which then performs position detection of the detected surface relative to a predetermined reference plane in accordance with a re-imaged position of the image of said measurement pattern, comprising:

a light source;

an irradiation optical system for irradiating light from said light source obliquely onto said reference plane;

a pattern plate having said measurement pattern, said pattern plate being located on a predetermined first plane so that the image of said measurement pattern is formed on said reference plane by said irradiation optical system;

a converging optical system for, in a state where the detected surface of said object to be detected is substantially coincident with said reference plane, converging light irradiated from said irradiation optical system and then reflected by the detected surface to re-image the image of said measurement pattern on a predetermined second plane; and detecting device for detecting said re-imaged position of the image of the measurement pattern on said second plane;

wherein the image of said measurement pattern comprises a linear image extending in a predetermined direction; and wherein said pattern plate is disposed such that an angle α between a direction in which the line image of said measurement pattern on the detected surface is displaced when the detected surface is moved along a direction perpendicular to said reference plane, and a longitudinal direction of the line image of said measurement pattern is in the range of from greater than 0° to less than 90°.

2. A surface position detecting apparatus according to claim 1, wherein said angle α is in the range of 10° to 80°.

3. A surface position detecting apparatus according to claim 1, wherein said first plane and said reference plane satisfy the Scheimpflug condition with respect to a principal plane of said irradiation optical system and wherein said reference plane and second plane satisfy the Scheimpflug condition with respect to a principal plane of said converging optical system.

4. A surface position detecting apparatus according to claim 1, wherein said pattern plate is optically transparent and wherein said measurement pattern of said pattern plate is formed such that light-transmitting portions and light-shielding portions extending in a predetermined direction are alternately arranged.

5. A surface position detecting apparatus according to claim 1, wherein said pattern plate is not optically transparent and wherein said measurement pattern of said pattern plate is formed such that slits extending in a predetermined direction are arranged in parallel and at a constant pitch.

6. A surface position detecting apparatus according to claim 1, wherein said pattern plate is a phase-type reflection diffraction grating.

7. A surface position detecting apparatus according to claim 1, wherein said pattern plate is an amplitude-type reflection pattern plate and wherein said measurement pattern of said pattern plate is formed such that reflecting portions and non-reflecting portions extending in a predetermined direction are alternately arranged.

8. A surface position detecting apparatus according to claim 1, wherein said measurement pattern of the pattern plate is so formed as to illuminate only desired measurement points on said reference plane.

9. A surface position detecting apparatus according to claim 1, wherein said pattern plate is arranged as rotatable about a predetermined axis perpendicular to said first plane.

10. A surface position detecting apparatus according to claim 1, wherein said detecting device comprises a photoelectric detector, a light-receiving surface of which is located on said second plane, for producing a detection signal changing depending upon the re-imaged position of the image of the measurement pattern on said second plane.

11. A surface position detecting apparatus according to claim 1, wherein said detecting device comprises two-dimensional scanning image pickup device, an image pickup surface of which is located on said second plane.

12. A surface position detecting apparatus according to claim 11, wherein said two-dimensional scanning image pickup unit is a two-dimensional charge-coupled image pickup device.

13. A surface position detecting apparatus according to claim 11, wherein an angle between a scanning direction on said image pickup surface of said two-dimensional scanning image pickup unit and the longitudinal direction of the linear image of said measurement pattern re-imaged on said second plane is set in the range of from greater than 0° to less than 90°.

14. A surface position detecting apparatus according to claim 11, comprising:

signal reading unit for reading image pickup signals of pixels within a predetermined region in said image pickup surface of said two-dimensional scanning image pickup unit; and adding unit for adding the image pickup signals from said signal reading unit as shifting the image pickup signals from each other in accordance with an angle between said longitudinal direction of the linear image and a displacement direction of the linear image of said measurement pattern re-imaged on said second plane when a surface position of the detected surface is changed.

15. A surface position detecting apparatus according to claim 1, wherein said detecting device comprises:

a deflecting optical system disposed on said second plane, for deflecting a direction of an optical axis of said converging optical system;

a relay optical system for forming on a predetermined third plane a further conjugate image of the image of the measurement pattern re-imaged on said second plane, using a beam deflected by said deflecting optical system; and a photoelectric detector a light-receiving surface of which is disposed on said third plane, for producing a detection signal changing according to a position of said conjugate image.

16. A surface position detecting apparatus according to claim 1, wherein said detecting device comprises:

a deflecting optical system disposed on said second plane, for deflecting a direction of an optical axis of said converging optical system;

a relay optical system for forming on a predetermined third plane a further conjugate image of the image of the measurement pattern re-imaged on said second plane, using a beam deflected by said deflecting optical system; and two-dimensional scanning image pickup unit an image pickup surface of which is located on said third plane.

17. A surface position detecting apparatus according to claim 16, wherein said two-dimensional scanning image pickup unit is a two-dimensional charge-coupled image pickup device.

18. A surface position detecting apparatus according to claim 16, wherein an angle between a scanning direction on said image pickup surface of said two-dimensional scanning image pickup unit and a longitudinal direction of the conjugate image on said third plane is in the range of from greater than 0° to less than 90°.

19. A surface position detecting apparatus according to claim 16, comprising:

signal reading unit for reading image pickup signals of pixels within a predetermined region in said image pickup surface of said two-dimensional scanning image pickup unit; and adding means for adding image pickup signals from said signal reading unit as shifting the image pickup signals from each other in accordance with an angle between a longitudinal direction of said conjugate image and a displacement direction of the conjugate image on said third plane when a surface position of the detected surface is changed.

20. A surface position detecting apparatus according to claim 1, wherein if the detected object is a wafer, on a surface as the detected surface of which a pattern is formed, an angle between a direction of said pattern and a longitudinal direction of the image of the measurement pattern formed on the surface of wafer is in the range of from greater than 0° to less than 90°.

21. A surface position detecting apparatus according to claim 20, wherein a direction in which the linear image of said measurement pattern is displaced when the surface of said wafer moves along a direction perpendicular to said reference plane, is arranged as parallel or perpendicular to a direction of the pattern on the surface of said wafer.

22. A surface position detecting method, in which an image of a predetermined measurement pattern is obliquely projected through an irradiation optical system onto a surface of a plate object to be detected, and in which position detection of the detected surface is performed relative to a predetermined reference plane in accordance with a re-imaged position of the image of said measurement pattern re-imaged by converging reflected light from the detected surface:

wherein the image of said measurement pattern comprises a linear image extending in a predetermined direction; and wherein an angle $\Phi$ between a direction in which the linear image of said measurement pattern on the detected surface is displaced when the detected surface moves along a direction perpendicular to said reference plane, and a longitudinal direction of the linear image of said measurement pattern, is in the range of from greater than 0° to less than 90°.

23. A surface position detecting method according to claim 22, wherein if the detected object is a wafer, on a surface as the detected surface of which a pattern is formed, an angle between the direction of said pattern and the longitudinal direction of the linear image of the measurement pattern formed on the surface of wafer is in the range of from greater than 0° to less than 90°.

24. A surface position detecting method according to claim 23, wherein a direction in which the linear image of said measurement pattern on the surface is displaced when the surface of said wafer moves along a direction perpendicular to said reference plane is arranged as parallel or perpendicular to the direction of the pattern on the surface of said wafer.

25. A projection type exposure apparatus comprising:

a projection optical system for projecting a pattern formed on a mask, onto a photosensitive substrate;

support unit for supporting the substrate, said support unit being arranged to adjust a position of the substrate in a direction parallel to a first optical axis of said projection optical system, a position of the substrate in two directions normal to said first optical axis and perpendicular to each other, and an inclination of the substrate relative to a plane which is perpendicular to said first optical axis;

a surface position detecting device for detecting a position of a surface of the substrate supported by said support unit; and control unit for controlling said support unit such that the surface of the substrate supported by said support unit is substantially coincident with a focus plane of said projection optical system, based on a result of detection by said surface position detecting device;

wherein said surface position detecting device, which projects an image of a predetermined measurement pattern obliquely onto the substrate surface, which converges reflected light from the substrate surface to re-image the image of said measurement pattern, and which then performs position detection of the substrate surface relative to said focus plane of said projection optical system in accordance with a re-imaged position of the image of said measurement pattern, includes:

a light source;

an irradiation optical system for irradiating light from said light source obliquely onto said focus plane;

a pattern plate having said measurement pattern, said pattern plate being located on a predetermined first plane so that the image of said measurement pattern is formed on said focus plane by said irradiation optical system;

a converging optical system for, in a state where the detected substrate surface is substantially coincident with said reference plane, converging light irradiated from said irradiation optical system and then reflected by the detected substrate surface to re-image the image of said measurement pattern on a predetermined second plane; and detecting device for detecting said re-imaged position of the image of the measurement pattern on said second plane;

wherein the image of said measurement pattern comprises a linear image extending in a predetermined direction; and wherein said pattern plate is disposed such that an angle α between a direction in which the line image of said measurement pattern on the detected substrate surface is displaced when the detected substrate surface is moved along said first optical axis of said projection optical system, and a longitudinal direction of the line image of said measurement pattern is in the range of from greater than 0° to less than 90°.

26. A projection type exposure apparatus according to claim 25, wherein said angle α is in the range of 10° to 80°.

27. A projection type exposure apparatus according to claim 25, wherein said first plane and said reference plane satisfy the Scheimpflug condition with respect to a principal plane of said irradiation optical system and wherein said reference plane and second plane satisfy the Scheimpflug condition with respect to a principal plane of said converging optical system.

28. A projection type exposure apparatus according to claim 25, wherein said pattern plate is optically transparent and wherein said measurement pattern of said pattern plate is formed such that light-transmitting portions and light-shielding portions extending in a predetermined direction are alternately arranged.

29. A projection type exposure apparatus according to claim 25, wherein said pattern plate is not optically transparent and wherein said measurement pattern of said pattern plate is formed such that slits extending in a predetermined direction are arranged in parallel and at a constant pitch.

30. A projection type exposure apparatus according to claim 25, wherein said pattern plate is a phase-type reflection diffraction grating.

31. A projection type exposure apparatus according to claim 25, wherein said pattern plate is an amplitude-type reflection pattern plate and wherein said measurement pattern of said pattern plate is formed such that reflecting portions and non-reflecting portions extending in a predetermined direction are alternately arranged.

32. A projection type exposure apparatus according to claim 25, wherein said measurement pattern of the pattern plate is so formed as to illuminate only desired measurement points on said focus plane.

33. A projection type exposure apparatus according to claim 25, wherein said pattern plate is arranged as rotatable about a predetermined axis perpendicular to said first plane.

34. A projection type exposure apparatus according to claim 25, wherein said detecting device comprises a photoelectric detector, a light-receiving surface of which is located on said second plane, for producing a detection signal changing depending upon the re-imaged position of the image of the measurement pattern on said second plane.

35. A projection type exposure apparatus according to claim 25, wherein said detecting device comprises two-dimensional scanning image pickup unit, an image pickup surface of which is located on said second plane.

36. A projection type exposure apparatus according to claim 35, wherein said two-dimensional scanning image pickup unit is a two-dimensional charge-coupled image pickup device.

37. A projection type exposure apparatus according to claim 35, wherein an angle between a scanning direction on said image pickup surface of said two-dimensional scanning image pickup unit and the longitudinal direction of the linear image of said measurement pattern re-imaged on said second plane is set in the range of from greater than 0° to less than 90°.

38. A projection type exposure apparatus according to claim 35, comprising:

signal reading unit for reading image pickup signals of pixels within a predetermined region in said image pickup surface of said two-dimensional scanning image pickup unit; and adding unit for adding the image pickup signals from said signal reading unit as shifting the image pickup signals from each other in accordance with an angle between said longitudinal direction of the linear image and a displacement direction of the linear image of said measurement pattern re-imaged on said second plane when a surface position of the detected substrate surface is changed.

39. A projection type exposure apparatus according to claim 25, wherein said detecting unit comprises:

a deflecting optical system disposed on said second plane, for deflecting a direction of an optical axis of said converging optical system;

a relay optical system for forming on a predetermined third plane a further conjugate image of the image of the measurement pattern re-imaged on said second plane, using a beam deflected by said deflecting optical system; and a photoelectric detector a light-receiving surface of which is disposed on said third plane, for producing a detection signal changing according to a position of said conjugate image.

40. A projection type exposure apparatus according to claim 25, wherein said detecting device comprises:

a deflecting optical system disposed on said second plane, for deflecting a direction of an optical axis of said converging optical system;

a relay optical system for forming on a predetermined third plane a further conjugate image of the image of the measurement pattern re-imaged on said second plane, using a beam deflected by said deflecting optical system; and two-dimensional scanning image pickup unit an image pickup surface of which is located on said third plane.

41. A projection type exposure apparatus according to claim 40, wherein said two-dimensional scanning image pickup unit is a two-dimensional charge-coupled image pickup device.

42. A projection type exposure apparatus according to claim 40, wherein an angle between a scanning direction on said image pickup surface of said two-dimensional scanning image pickup unit and a longitudinal direction of the conjugate image on said third plane is in the range of from greater than 0° to less than 90°.

43. A projection type exposure apparatus according to claim 40, comprising:

signal reading unit for reading image pickup signals of pixels within a predetermined region in said image pickup surface of said two-dimensional scanning image pickup unit; and adding unit for adding image pickup signals from said signal reading unit as shifting the image pickup signals from each other in accordance with an angle between a longitudinal direction of said conjugate image and a displacement direction of the conjugate image on said third plane when a surface position of the detected substrate surface is changed.

44. A projection type exposure apparatus according to claim 25, wherein if the substrate is a wafer, on a surface as the detected surface of which a pattern is formed, an angle between a direction of said pattern and a longitudinal direction of the image of the measurement pattern formed on the surface of wafer is in the range of from greater than 0° to less than 90°.

45. A projection type exposure apparatus according to claim 44, wherein a direction in which the linear image of said measurement pattern is displaced when the surface of said wafer moves along said first optical axis, is arranged as parallel or perpendicular to a direction of the pattern on the surface of said wafer.

46. A surface position detecting apparatus comprising:

an irradiation optical system for irradiating light obliquely onto a reference plane;

a pattern plate having a measurement pattern and located on a predetermined first plane to form the image of said measurement pattern on said reference plane by said irradiation optical system;

a converging optical system for converging light irradiated from said irradiation optical system and then reflected by a surface of a plate object to be detected to re-image the image of said measurement pattern on a predetermined second plane; and detecting device for detecting said re-imaged position of the image of the measurement pattern on said second plane, wherein the image of the measurement pattern comprises a linear image extending in a predetermined direction and wherein an angle between a direction in which the linear image is displaced when the surface is moved perpendicular to a reference plane and a longitudinal direction of the linear image is in the range of from greater than 0 to less than 90 degrees.

47. A projection type exposure apparatus comprising:

a projection optical system for projecting a pattern formed on a mask, onto a photosensitive substrate;

support unit for supporting the substrate, said support unit being arranged to adjust a position of the substrate in a direction parallel to a first optical axis of said projection optical system, a position of the substrate in two directions normal to said first optical axis and perpendicular to each other, and an inclination of the substrate relative to a plane which is perpendicular to said first optical axis;

a surface position detecting device for detecting a position of a surface of the substrate supported by said support unit; and control unit for controlling said support unit such that the surface of the substrate supported by said support unit is substantially coincident with a focus plane of said projection optical system, based on a result of detection by said surface position detecting device;

wherein said surface position detecting device comprises
an irradiation optical system for irradiating light obliquely onto a reference plane;
a pattern plate having a measurement pattern and located on a predetermined first plane to form the image of said measurement pattern on said reference plane by said irradiation optical system;
a converging optical system for converging light irradiated from said irradiation optical system and then reflected by a surface of a plate object to be detected to re-image the image of said measurement patter on a predetermined second plane; and
detecting device for detecting said re-imaged position of the image of the measurement pattern on said second plane, wherein the image of the measurement pattern comprises a linear image extending in a predetermined direction and wherein an angle between a direction in which the linear image is displaced when the surface is moved perpendicular to a reference plane and a longitudinal direction of the linear image is in the range of from greater than 0 to less than 90 degrees.

* * * * *